(12) United States Patent  
Clague

(10) Patent No.: US 12,219,689 B1  
(45) Date of Patent: Feb. 4, 2025

(54) POSITRON SOURCE AND METHOD

(71) Applicant: Ian Clague, Bristol (GB)

(72) Inventor: Ian Clague, Bristol (GB)

( * ) Notice: Subject to any disclaimer, the term of this patent is extended or adjusted under 35 U.S.C. 154(b) by 0 days.

(21) Appl. No.: 18/658,209

(22) Filed: May 8, 2024

(30) Foreign Application Priority Data

Mar. 4, 2024 (GB) ..................... 2403097

(51) Int. Cl.
H01J 27/00 (2006.01)
H01J 37/06 (2006.01)
H05H 1/54 (2006.01)

(52) U.S. Cl.
CPC .............. *H05H 1/54* (2013.01); *H01J 37/06* (2013.01); *H01J 2237/06391* (2013.01)

(58) Field of Classification Search
CPC ... H05H 1/54; H01J 37/06; H01J 2237/06391
See application file for complete search history.

(56) References Cited

U.S. PATENT DOCUMENTS

| 5,262,651 | A | * | 11/1993 | Bradshaw | H01J 37/3174 |
| | | | | | 250/492.2 |
| 5,519,738 | A | * | 5/1996 | Hirose | G21G 1/10 |
| | | | | | 376/195 |
| 2002/0030160 | A1 | * | 3/2002 | Greaves | H01J 3/40 |
| | | | | | 250/308 |
| 2002/0172317 | A1 | | 11/2002 | Maksimchuk et al. | |
| 2004/0178353 | A1 | * | 9/2004 | Perez | H05H 6/00 |
| | | | | | 250/427 |
| 2023/0059196 | A1 | | 2/2023 | Clague | |

FOREIGN PATENT DOCUMENTS

CN 104735895 A 6/2015

OTHER PUBLICATIONS

The Barcelona Institute of Science and Technology, Valerio Di Giulio and F. Javier Garcia de Abajo, "Nanophotonics for Pair Production," Aug. 21, 2023, Barcelona, Spain.
UCLA Department of Physics and Astronomy, Boffo et al., "Positron Sources for Future High Energy Physics Colliders," Apr. 28, 2022, Los Angeles, CA.
UK Intellectual Property Office, Combined Search and Examination Report dated Oct. 4, 2024 (14 pages).

* cited by examiner

*Primary Examiner* — Elmito Breval
(74) *Attorney, Agent, or Firm* — Tatonetti IP

(57) ABSTRACT

There is provided a positron source for generating a positron beam. The positron source includes a laser arrangement configured to generate a beam of photons. A target is configured to receive the beam, wherein the target is arranged for the photons of the beam to generate a photon plasma at a surface layer of the target, wherein the surface layer is configured to preferentially absorb electrons from the photon plasma to generate corresponding free positrons. An electrode arrangement with one or more electrodes is configured to apply an electric field to the photon plasma to extract the free positrons therefrom and to guide the positrons to form the positron beam. At least the target and the electrode arrangement are included within a vacuum chamber configured in use to provide a vacuum condition in which the target and the electrode arrangement are arranged to function.

23 Claims, 12 Drawing Sheets

SIDE VIEW

SIDE VIEW

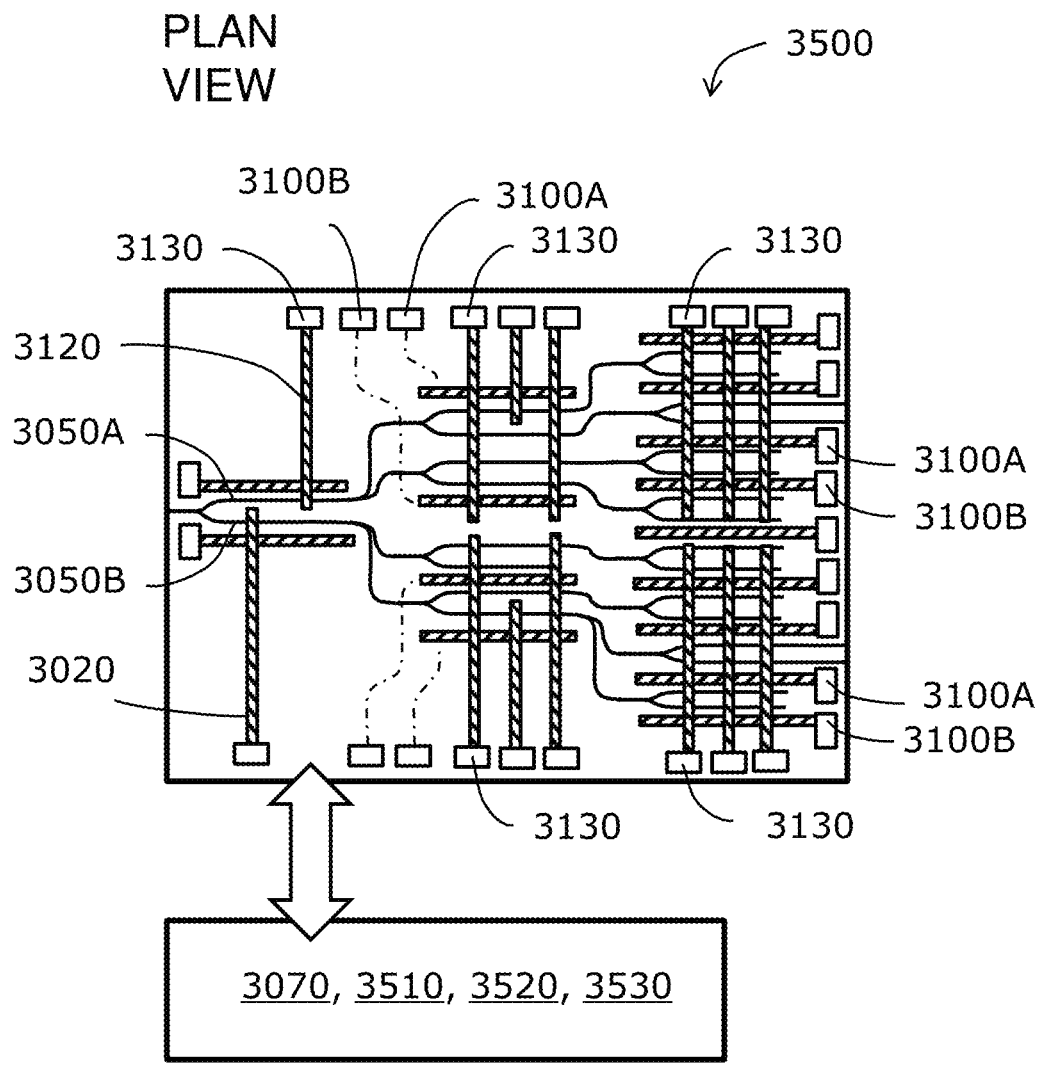

There are used one or more non-linear optical effects that include an optical Kerr effect. The optical Kerr effect results in a refractive index change that causes electrons to group with other electrons, and likewise positrons to group with other positrons, resulting in an enhanced positron-electron dipole to arise, and thereby enhanced acceleration experienced by the electrons and the positrons in a positron source.

FIG. 10

POSITRON SOURCE AND METHOD

TECHNICAL FIELD

The present disclosure relates to positron sources. Moreover, the present disclosure relates to methods for operating aforesaid positron sources. Furthermore, the present disclosure relates to software products that are executable on computing hardware to implement the methods for operating the positron sources.

BACKGROUND

In modern physics, there occur "ordinary matter" and corresponding antimatter. Antimatter may be thought of as being matter with reversed charge, parity and time, known as CPT reversal. Antimatter occurs in natural processes, for example in cosmic ray collisions occurring in the Earth's upper atmosphere and also as a component generated during radioactive decay. On Earth, antimatter tends to annihilate with ordinary matter to generate electromagnetic radiation. However, it is known to store antimatter under vacuum conditions in at least one of strong electrostatic and magnetic fields for periods of up to circa 1000 hours. The ALPHA project at CERN is concerned with generating positrons for research purposes, wherein the ALPHA project makes use of a high-energy particle accelerator to generate high-energy ordinary matter particles at an energy of GeV that are applied to a high atomic weight ("high-Z") target to generate a range of secondary particles including a portion of positrons at high energy, a decelerator to decelerate the high energy positrons to provide corresponding lower-energy positrons, and a vacuum storage ring arrangement to store the lower-energy positrons for use in various experiments and research. Hardware of the ALPHA project is spatial extensive and requires large building to accommodate it.

Although minuscule numbers of antiparticles may be generated using particle accelerators, a total artificial production of antimatter has contemporarily been only a few nanograms. No macroscopic amount of antimatter has ever been assembled due to the extreme cost and difficulty of producing and handling antimatter. Nonetheless, antimatter is an essential component of widely-available apparatus that utilize beta decay, such as in positron emission tomography apparatus, radiation therapy apparatus, and industrial imaging apparatus.

Positron beams are conventionally produced either by using β-emitting radioactive sources or by using pair production by photons. Positrons are normally obtained either from neutron-induced nuclear reactions such as $^{113}Cd(n, \gamma)$ $^{114}Cd$ or from electron-induced electromagnetic showers in solid targets. Thus, commonly used positron radioactive sources include $^{22}Na$, $^{58}Co$, $^{64}Cu$, but are not limited thereto. The half-life of these radioactive sources is not long in temporal duration, so positron beams derived from the radioactive sources will decrease significantly over a period of time. Moreover, the preparation of the radioactive sources is also relatively cumbersome and costly. Currently, $^{22}Na$ is the most commonly used radioactive positron source due to its longest half-life relative to other isotopes that exhibit beta-particle (β-emitting) decay.

As described in a published PCT patent application PCT/IB2022/057745 ("System and method for generating power", inventor Ian Clague), it is shown that a photon may be considered to be a composite particle comprising an electron orbiting a positron; as the electron has a positive mass and the positron has a negative mass, their corresponding photon has zero mass, enabling the photon to propagate at "the speed c of light", namely 299,792,458 metres per second in vacuum. An energy of the photon (namely E=hf wherein h is Plank's constant, E is the energy of the photon and f is the frequency of the photon) is determined by parameters of the precession orbit of the electron and its corresponding positron in the photon; for example, lower energy infra-red photons have a larger precession orbit and therefore a longer corresponding wavelength than, example, a gamma-ray photon. Such orbits are, for example, manifest in interference fringes generated using photons, for example in diffraction gratings.

In a published Chinese patent application CN104735895A, there is described a laser plasma pulse positron source. The source comprises a laser source and a vacuum target chamber. Laser radiation photons emitted by the laser source are transmitted through a window of the vacuum target chamber to be irradiated onto a planar reflecting mirror of the vacuum target chamber. Laser radiation photons reflected by the planar reflecting mirror are focused to a feed-forward disc-shaped target in a solid target assembly via an off-axis parabolic focusing mirror. The target material uses conventional high atomic number (namely high-Z) metal materials in the solid target assembly in the vacuum target chamber, wherein the disc-shaped target is fixed to a rotatable shaft. A drive motor drives the rotatable shaft to rotate so as to drive the disc-shaped target to rotate. The disc-shaped target, the rotating shaft and the drive motor are arranged on an electric lifting platform. A synchronizing signal generator controls the drive motor, the electric lifting platform and the laser source synchronously. By using the laser plasma pulse positron source, picosecond-level pulse positron beams may be generated, wherein the laser plasma pulse positron source is suitable for detection and diagnosis related to using positrons. Although the laser plasma pulse positron source is capable of generating positrons without a need for high-energy particle accelerators to be used, in contradistinction to the ALPHA project at CERN for example, there is a need for yet more efficient ways of generating antimatter, in particular positrons, for example to enable use of antimatter in propulsion systems as well as energy storage and generation systems.

In a published research paper, "*Nanophotonics for pair production*", by authors Valerio Di Giulio, F. Javier García de Abajo, there is disclosed a theoretical analysis of the transformation of electromagnetic energy into matter by way of the creation of electron-positron pairs from light. However, in the research paper, it is disclosed that this phenomenon has a very low probability, such that contemporary positron sources rely instead on beta decay as aforementioned, which demands elaborate monochromatization and trapping schemes to achieve high-quality positron beams. In the published research paper, it is proposed to use intense, strongly confined optical near fields supported by a nanostructured material in combination with high-energy photons to create electron-positron pairs. Specifically, it is proposed that the interaction between near-threshold gamma-rays and polaritons yields higher pair-production cross sections, largely exceeding those associated with free-space photons. In practice, such a technique will be difficult (if not impossible) to implement in practice for various technical reasons.

In a publication "*Coherent propulsion with negative-mass fields in a photon lattice*", Yumiao Pei, et al., Vol. 44 No. 24, December 2019, Optics Letters, there is described a theoretical basis for coherent propulsion with negative-mass fields in an optical analog, wherein there are observed self-accelerating states, driven by nonlinear coherent interactions of two components that are experiencing diffractions of opposite signs in a photonic lattice; such a situation is analogous to an interaction of two objects with mutually opposite mass signs. In the publication, there is described an experimental setup including a continuous wave (CW) green laser emitting radiation at a wavelength of 532 nm. There is further used a waveguide array having a lattice period of 6.8 µm which is fabricated by Titanium in-diffusion in a non-linear photorefractive Lithium Niobate (LiNbO$_3$) crystal that, in use, exhibits a self-defocusing non-linearity arising from a bulk photovoltaic effect. There arise positive-mass and negative-mass fields in the crystal. In overview, the positive-mass and negative-mass fields are able to affect photons propagating in the crystal to cause electron beams and positron beams to form within the crystal, wherein the beams propagate because they are still described by a coherent wavefunction pursuant to the Schrödinger equation. There therefrom arises an action-reaction symmetry that breaks Newton's third law, wherein the symmetry abides to both energy and momentum conservation. When spatial separation of electrons and positrons occurs in the crystal, acceleration effects between the electrons and positrons are observed. The publication in Optics Letters has been peer-reviewed and is to be now regarded as accepted main-stream scientific knowledge.

In a further scientific publication *"Self-accelerating beams of photons and electrons"* by author Ady Arie, Tel Aviv, Israel, CLEO: 2014, there is disclosed properties of optical, electron and plasmon beams that preserve their shape, while propagating along curved trajectories in free-space or propagating on a surface. When such surface propagation occurs, there arise surface-plasmon-polaritons that are surface electromagnetic waves that occur at an interface between a metal and dielectric medium and are coupled to collective electron oscillations in the metal.

Despite aforesaid insight into interactions between optical beams and crystal substrates have been published, there has been a lack of commercial use of the effects to provide practical devices for positron generation, as well as providing energy conversion apparatus. The present disclosure seeks to address the lack. It is to be appreciated that none of the embodiments of the present disclosure described below are in violation of known laws of physics; moreover, it is to be appreciated that classic Newtonian laws must be interpreted appropriately in view of recent contemporary scientific research, for example as elucidated in the foregoing publications.

SUMMARY

The present disclosure seeks to provide a practical positron source that functions to convert photons to corresponding positrons and electrons in a more efficient manner than has hitherto been feasible. Moreover, the present disclosure seeks to provide an improved method for operating the aforesaid positron source.

According to a first aspect, there is provided a positron source as defined in the appended claim 1. The positron source is of advantage in that its target is designed to preferentially capture electrons from incident photons that increases a yield of positrons emitted from the target, wherein the target is optionally fabricated from p-type doped material exhibiting electron-capturing holes. Beneficially, from p-type doped material exhibiting electron-capturing holes is fabricated from a semiconductor material, Graphene or similar.

There is provided a positron source for generating a positron beam, wherein the positron source includes:
- a laser arrangement configured to generate a beam of photons;
- a target configured to receive the beam of photons, wherein the target is arranged for the photons of the beam to generate a photon plasma at a surface layer of the target, wherein the surface layer is configured to preferentially absorb electrons from the photon plasma to generate corresponding free positrons; and
- an electrode arrangement comprising one or more electrodes that are configured to apply an electric field to the photon plasma to extract the free positrons therefrom and to guide the positrons to form the positron beam;
- wherein at least the target and the electrode arrangement are included within a vacuum chamber configured in use to provide a vacuum condition in which the target and the electrode arrangement are arranged to function.

Optionally, the surface layer is configured to include a doped semiconductor material for providing the surface layer. More optionally, the doped semiconductor material includes at least one of: p-doped Silicon, p-doped Gallium Arsenide, p-doped Graphene, Graphene, p-doped Silicon Carbide.

Optionally, the positron source is configured for the beam of photons to propagate in a direction that is substantially parallel to a plane of the surface layer when the beam of photons is received at the surface layer for generating the photon plasma. More optionally, the positron source is configured for the beam of photons to propagate as an evanescent wave over the surface layer when generating the photon plasma.

Optionally, the target, for example implemented as a planar target, is supported on a rotatable table that is arranged to rotate when the positron source is in operation, to increase an area of the surface layer that is exposed to the beam of photons.

Optionally, the positron source further includes a beam scanner for scanning the beam of photons over the surface layer when the positron source is in operation, to increase an area of the surface layer that is exposed to the beam of photons. More optionally, the beam scanner is implemented as an actuated or rotatable mirror, prism or diffraction grating.

Optionally, the electrode arrangement is configured to remove a native oxide of the surface layer prior to the surface layer being configured to interact with the photon plasma to generate positrons, wherein the electrode arrangement is configured to be driven by a radio-frequency signal to excite a trace gas introduced into the vacuum chamber to cause sputtering or reactive ion etching at the surface layer.

Optionally, the laser arrangement is configured to generate the beam of photons as a pulsed photon beam. More optionally, the pulsed photon beam has a pulse energy in a range of 10 milliJoules to 1 Joule per pulse, and a pulse duration in a range of 10 picoSeconds to 100 nanoSeconds.

Optionally, the laser arrangement is configured to generate the beam of photons to have a radiation wavelength in a range of 50 nm to 2 µm.

Optionally, the positron source is configured to move the beam or photons in a step-wise manner over the surface layer, wherein the beam of photons at the surface layer is substantially stationary at an instance that a pulse of photons is output from the laser arrangement.

Optionally, the electrode arrangement further includes a first electrode for generating an electric field to extract positrons from the photon plasma, and one or more second electrodes for forming the positron beam to be at least one of: divergent, collimated, convergent.

Optionally, the positron source is configured to include a mirror arrangement for guiding the photon beam to make multiple passes over the surface layer in use, to enhance a yield of positrons generated at the surface layer for a given pulse energy of the photon beam.

Optionally, the positron source is configured for use with at least one of: an electron microscope, a positron tomography apparatus, a semiconductor manufacturing apparatus, an energy storage device, a propulsion device.

According to a second aspect, there is provided a method as defined in appended claim 13. The method is of advantage in that the method enables the positron source to be operated more efficiently to generate positrons for use on research, in positron tomography, in energy storage, in material characterization, in microscopy and so forth.

There is provided a method for (namely, a method of) operating a positron source for generating a positron beam therefrom, wherein the positron source includes: a laser arrangement configured to generate a beam of photons;
 a target configured to receive the beam of photons;
 an electrode arrangement comprising one or more electrodes;
 wherein at least the target and the electrode arrangement are included within a vacuum chamber;
 wherein the method includes:
 configuring the vacuum chamber in use to provide a vacuum environment in which at least the target and the electrode arrangement are arranged to function;
 configuring the positron source for the photons of the beam to generate a photon plasma at a surface layer of the target, wherein the surface layer is configured to preferentially absorb electrons from the photon plasma to generate corresponding free positrons; and
 configuring the one or more electrodes to apply an electric field to the photon plasma to extract the free positrons therefrom and to guide the positrons to form the positron beam.

Optionally, the method includes configuring the surface layer to include a doped semiconductor material for providing the surface layer. More optionally, the method includes arranging for the doped semiconductor to include at least one of: p-doped Silicon, p-doped Gallium Arsenide, p-doped Graphene, Graphene, p-doped Silicon Carbide.

Optionally, the method includes configuring the positron source for the beam of photons to propagate in a direction that is substantially parallel to a plane of the surface layer when the beam of photons is received at the surface layer for generating the photon plasma. More optionally, the method includes arranging for the beam of photons to propagate as an evanescent wave over the surface layer when generating the photon plasma.

Optionally, the method includes supporting the target on a rotatable table that is arranged to rotate when the positron source is in operation, to increase an area of the surface layer that is exposed to the beam of photons.

Optionally, the method includes arranging for the positron source to further include a beam scanner for scanning the beam of photons over the surface layer when the positron source is in operation, to increase an area of the surface layer that is exposed to the beam of photons. More optionally, the method includes implementing the beam scanner as an actuated or rotatable mirror, prism or diffraction grating.

Optionally, the method includes configuring the electrode arrangement to remove a native oxide of the surface layer prior to the surface layer being configured to interact with the photon plasma to generate positrons, wherein the electrode arrangement is configured to be driven by a radio-frequency signal to excite a trace gas introduced into the vacuum chamber to cause sputtering or reactive ion etching at the surface layer.

Optionally, the method includes configuring the laser arrangement to generate the beam of photons as a pulsed photon beam. More optionally, the method includes arranging for the pulsed photon beam to have a pulse energy in a range of 10 milliJoules to 1 Joule per pulse, and a pulse duration in a range of 10 picoSeconds to 100 nanoSeconds.

Optionally, the method includes configuring the laser arrangement to generate the beam of photons to have a radiation wavelength in a range of 50 nm to 2 µm.

Optionally, the method includes configuring the positron source to move the beam of photons in a step-wise manner over the surface layer, wherein the beam of photons at the surface layer is substantially stationary at an instance that a pulse of photons is output from the laser arrangement.

Optionally, the method further includes configuring the electrode arrangement to include a first electrode for generating an electric field to extract positrons from the photon plasma, and one or more second electrodes for forming the positron beam to be at least one of: divergent, collimated, convergent.

Optionally, the method includes configuring the positron source to include a mirror arrangement for guiding the photon beam to make multiple passes over the surface layer is use, to enhance a yield of positrons generated at the surface layer for a given pulse energy of the photon beam.

Optionally, the method includes configuring the positron source for use with at least one of: an electron microscope, a positron tomography apparatus, a semiconductor manufacturing apparatus, an energy storage device, a propulsion device.

According to a third aspect, there is provided a software product stored on a machine-readable data carrier, as claimed in claims 14. There is provided a software product stored on a machine-readable data carrier that is executable on computing hardware to implement the method of the second aspect.

According to a fourth aspect, there is provided a positron source for generating a positron beam, wherein the positron source includes an optical waveguide array device including a substrate, and at least one waveguide structure formed onto the substrate, wherein the at least one waveguide structure is fabricated at least in part from a material that exhibits one or more non-linear optical effects when in use, and an electrode arrangement configured to control the one or more non-linear optical effects and to extract at least one of accelerated electrons and positrons from the at least one waveguide structure, and wherein the optical waveguide array device is configured in use to separate photons input on the at least one waveguide structure using the one or more non-linear optical effects into their respective electrons and positrons, and to guide the respective electrons and positrons into their respective regions of the at least one waveguide structure to cause a matter-antimatter dipole to be formed within the at least one waveguide structure waveguide structure for imparting energy to at least one of the electrons and the photons to cause acceleration thereof, wherein the positrons are extracted to generate the positron beam.

Beneficially, the one or more non-linear optical effects includes an optical Kerr effect. The optical Kerr effect results in a refractive index change that causes electrons to group with other electrons, and likewise positrons to group with other positrons, resulting in an enhanced positron-electron dipole, and thereby an enhancing acceleration experienced by the electrons and the positrons in the positron source.

Optionally, the positron source is configured, wherein the substrate is fabricated from a dielectric material, and the material of the at least one waveguide structure includes at least one of: Lithium Niobate ($LiNiO_3$), Barium Niobate ($BaNiO_3$), Graphene.

Optionally, the positron source is configured, wherein the substrate is fabricated from at least one of: quartz, fused silica.

Optionally, the positron source is configured, wherein the electrode arrangement comprises a configuration of electrodes whose elongate axes are configured to be substantially parallel to, or substantially orthogonal to, elongate axes of a plurality elongate waveguides into which the corresponding electrons and positrons are selectively diverted when the device is in operation. More optionally, a least one of the electrodes intersects or overlays a portion of the waveguide structure for selectively controlling positrons or electrons generated in the positron source from photons provided, when in use, to the at least one waveguide structure.

More optionally, the positron source is configured, wherein the electrode arrangement is fabricated from at least one of: Titanium, Aluminium, Indium, Silver.

Optionally, the positron source is configured, wherein the device includes a plurality of the at least one waveguide structure arranged in a cascaded configuration.

Optionally, the positron source is configured, wherein the device further includes a laser arrangement configured in use to provide photons to the at least one waveguide structure. More optionally, the positron source is configured, wherein the laser arrangement is configured to function in at least one of: a continuous mode, a pulsed mode, a combination of continuous and pulsed modes.

Optionally, the positron source is configured, wherein waveguides of the at least one waveguide structure are disposed in a parallel mutually spaced-apart manner with a distance (d) therebetween, wherein the distance is substantially of a similar size to a wavelength of the photons supplied to the at least one waveguide structure when in operation. More optionally, the positron source is configured, wherein the distance (d) is configured to allow for photon coherence to be maintained between mutually adjacent elongate waveguides of the at least one waveguide structure. Optionally, the distance d is in a range of 30 nm to 1 μm. Optionally, the waveguides each have a width (w) in a range of 50 nm to 2 μm. Optionally, the waveguides each have a thickness (t), relative to a plane of a substrate on which they are formed, in a range of 20 nm to 2 μm. Optionally, the waveguides have a length in a range of 100 μm to 10 mm.

Optionally, the positron source is configured to function from photons have a wavelength in a range of 150 nm to 3 μm, more optionally substantially 1500 nm.

According to a fifth aspect, there is provided a method for operating a positron source to generate a positron beam, wherein the positron source includes an optical waveguide array device including a substrate, and at least one waveguide structure formed onto the substrate, wherein the method includes:

(i) arranging for the at least one waveguide structure to be fabricated at least in part from a material that exhibits one or more non-linear optical effects when in use;

(ii) configuring an electrode arrangement to control the one or more non-linear optical effects and to extract at least one of accelerated electrons and positrons from the at least one waveguide structure;

(iii) configuring the optical waveguide array device, when in use, to separate photons input on the at least one waveguide structure using the one or more non-linear optical effects into their respective electrons and positrons; and (iv) guiding the respective electrons and positrons into their respective regions of the at least one waveguide structure to cause a matter-antimatter dipole to be formed within the at least one waveguide structure waveguide structure for imparting energy to at least one of the electrons and the positrons to cause acceleration thereof, wherein the method further comprises extracting the positrons to form the positron beam.

Beneficially, when implementing the method, the one or more non-linear optical effects includes an optical Kerr effect. The optical Kerr effect results in a refractive index change that causes electrons to group with other electrons, and likewise positrons to group with other positrons, resulting in an enhanced positron-electron dipole, and thereby an enhanced acceleration experienced by the electrons and the positrons in the positron source.

Optionally, the method includes fabricating the substrate from a dielectric material, and arranging for the material of the at least one waveguide structure to include at least one of: Lithium Niobate ($LiNiO_3$), Barium Niobate ($BaNiO_3$), Graphene.

Optionally, the method includes fabricating the substrate from at least one of: quartz, fused silica. However, other dielectric material may alternatively be used.

Optionally, in the method, the electrode arrangement comprises a configuration of electrodes whose elongate axes are configured to be substantially parallel to, or substantially orthogonal to, elongate axes of a plurality elongate waveguides into which the corresponding electrons and positrons are selectively diverted when the device is in operation. More optionally, in the method, the electrode arrangement is fabricated from at least one of: Titanium, Aluminium, Indium, Silver. Other metals or doped semiconductor materials may optionally be used.

Optionally, the method includes arranging for the device to include a plurality of the at least one waveguide structure arranged in a cascaded configuration.

Optionally, the method further includes arranging for the device to further include a laser arrangement configured in use to provide photons to the at least one waveguide structure. More optionally, the method includes configuring the laser arrangement to function in at least one of: a continuous mode, a pulsed mode, a combination of continuous and pulsed modes. The photons beneficially have a wavelength in a range of 100 nm to 3 μm, optionally a wavelength of substantially 1500 nm.

Optionally, the method includes arranging for waveguides of the at least one waveguide structure to be disposed in a parallel mutually-spaced-apart manner with a distance (d) therebetween, wherein the distance is substantially of a similar size to a wavelength of the photons supplied to the at least one waveguide structure when in operation. More optionally, the method includes configuring the distance (d)

to allow for photon coherence to be maintained between mutually adjacent elongate waveguides of the at least one waveguide structure.

According to a sixth aspect, there is provided a software product recorded on a machine-readable data carrier, wherein the software product is executable on computing hardware of the device of the fourth aspect, to implement a method of the fifth aspect.

DESCRIPTION OF DIAGRAMS

Embodiments of the invention will be described with reference to the following drawings, wherein:

FIG. 10 is a schematic illustration of an optical waveguide array apparatus, including a plurality of the optical waveguide arrays of FIG. 8A, 8B, 8C or 9 configured in a cascaded formation.

DESCRIPTION OF EMBODIMENTS

In developing the positron source of the present disclosure, the technical problems associated with using aforesaid radioactive sources undergoing beta decay was very much borne in mind. Moreover, the impracticality of using large particle accelerators and high-Z targets as aforementioned, to yield relatively small quantities of positron, was also borne on mind. It was appreciated that a relatively compact and safe apparatus for generating copious quantities of positrons is required by industry and research establishments. Embodiments of the present disclosure are reduction-to-practice practical implementations of positron sources.

Figure 1:
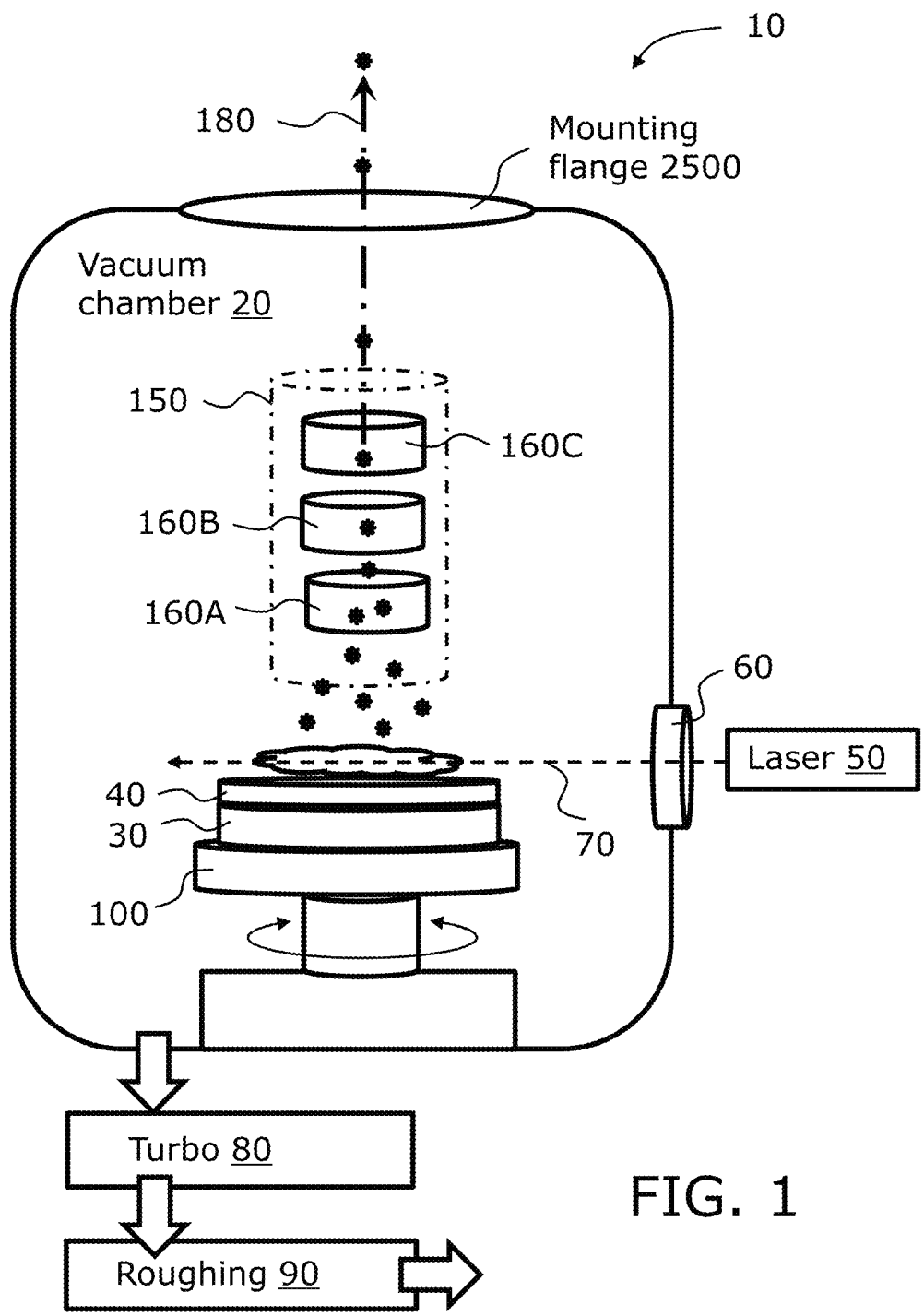
FIG. 1 is a schematic illustration of an implementation of a positron source according to the present disclosure.

Referring to FIG. 1, there are shown basic component parts of a positron source indicated generally by 10. The positron source 10 includes a vacuum chamber 20, for example machined from stainless steel, in which is mounted a planar target 30. Optionally, the planar target 30 is circular in surface profile; moreover, optionally, the planar target 30 conveniently has a diameter in a range of 1 cm to 5 cm. The planar target 30 is fabricated with at least a surface layer 40 of p-type material that is capable of preferentially absorbing electrons from a photon plasma formed in operation in close proximity to the surface layer 40, for example within a few micrometres above the surface layer 40. The surface layer 40 is optionally a doped semiconductor material, for example p-doped Silicon, p-doped Gallium Arsenide, p-doped Lithium Niobate, p-doped Silicon Carbide, or p-doped Graphene; these materials are to be regarded as low-Z materials in contradistinction to high-Z materials as customarily used in contemporary known positron generators. Moreover, p-doped Graphene may be generated by incorporating Boron atoms into a Graphene layer, alternatively by treating a Graphene layer to nitric acid. Doping levels of the doped semiconductor material is beneficially in a range as typically used in the contemporary semiconductor industry. A remainder of the planar target 30 may beneficially be configured to include a substantial amount of at least one of bulk Silicon or a heat-conductive metal (for example Titanium, Copper, stainless steel or Aluminium) to assist to dissipate thermal energy imparted to the surface layer 40 when the positron source 10 is in operation. The positron source 10 also includes a laser arrangement 50, wherein the laser arrangement 50 is optionally mounted outside the vacuum chamber 20, wherein the vacuum chamber 20 includes a quartz or fused silica port window 60 through which a photon beam 70 generated in use by the laser arrangement 50 may propagate to impact onto or slightly above the surface layer 40 of the planar target 30. The laser arrangement 50 is beneficially implemented as a pulsed laser, for example an Excimer pulsed laser (although other types of laser may be optionally used, for example pulsed UV lasers as commonly used in the contemporary semiconductor industry for sub-micron lithographic purposes). Alternatively, the laser arrangement 50 may be implemented as a solid-state laser mounted within the vacuum chamber 20 and provided with cooling via an Aluminium or Copper plate that forms a wall portion of the vacuum chamber 20. The laser arrangement 50 is optionally configured to provide the photon beam 70 including photons having a wavelength in a range of 50 nm to 2 μm, for example substantially 1500 nm, more optionally substantially in a range of 800 nm to 100 nm. Each pulse of the photon beam 70 is beneficially in a range of 10 milli-Joules to 1 Joule in energy, depending on a diameter of the photon beam 70 that the laser arrangement 50 is able to provide in use. Each pulse optionally beneficially has a duration of 10 picoSeconds to 100 nanoSeconds. In operation, the positron source 10 is configured so that the photon beam 70 skims a plane of the surface layer 40 as an evanescent wave that strongly interacts with the surface layer 40 as well as forming a photon plasma just above the surface layer 40. The p-type material of the surface layer 40 functions to extract electrons from the photon plasma to allow their corresponding positrons to exit the photon plasma and be attracted away from the planar target 30 by using an electrostatic field generated using a suitable electrode arrangement, as will be described in greater detail later, to be formed into a positron beam 180.

The vacuum chamber 20 is provided with a turbopump 80 that is mounted spatially locally to the vacuum chamber 20, for example bolted to a side of the vacuum chamber 20 and coupled via its input port to an internal volume of the vacuum chamber 20, and a roughing pump 90 that may be mounted to be remote from the turbo pump 80 and coupled to an output port of the turbopump 80. Such an arrangement enables the vacuum chamber 20 to be relatively compact and mountable via a mounting flange 2500 to other vacuum equipment, for example scanning or transmission electron microscopes, tomography apparatus and such like. In combination, the turbopump 80 and the roughing pump 90 enable a vacuum in a range of $10^{-7}$ mBar to $10^{-11}$ mBar to be achieved within the vacuum chamber 20 when the positron source 10 is in operation.

Figure 2:
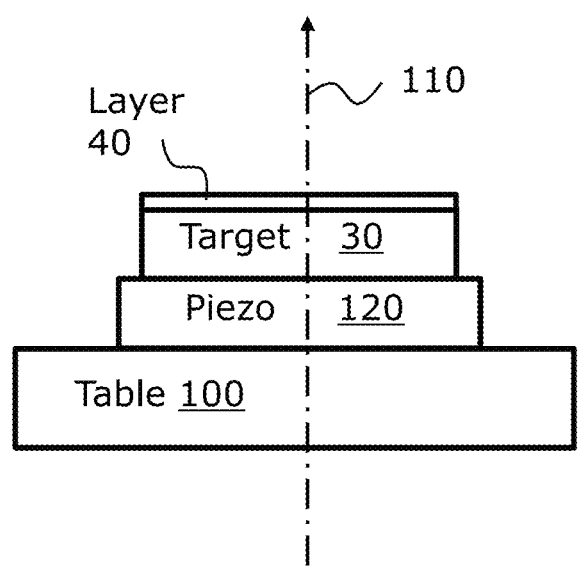
FIG. 2 is a schematic illustration of a planar target included within the positron source of FIG. 1.

As illustrated in FIG. 2, optionally, the planar target 30 is mounted onto a rotatable table 100 whose central axis 110 of rotation in use is aligned substantially to a centre of the planar target 30. Beneficially, the rotatable table 100 is mounted onto graphite bearings (for example Graphalloy® bearings) and driven by a vacuum-compatible electric motor, for example a stepper motor. When the positron source 10 is in operation with the planar target 30 receiving pulses of photons provided via the photon beam 70, rotating the planar target 30 assists to distribute power dissipation more evenly through the planar target 30, to avoid the surface layer 40 becoming ablated or damaged by pulses of the photon beam 70. Optionally, a piezo-electric transducer 120 is mounted between the planar target 30 and the rotatable table 100 and provided with a drive signal that is synchronized to the pulses of photons generated by the laser arrangement 50, wherein the piezo-electric transducer maintains the planar target 30 momentary spatially stationary relative to the photon beam 70 at an instance of a given photon pulse, to prevent the photon plasma being smeared over the surface layer 40. Such an avoidance of smearing increases a yield of positrons from the positron source 10 when in operation.

Figure 3:
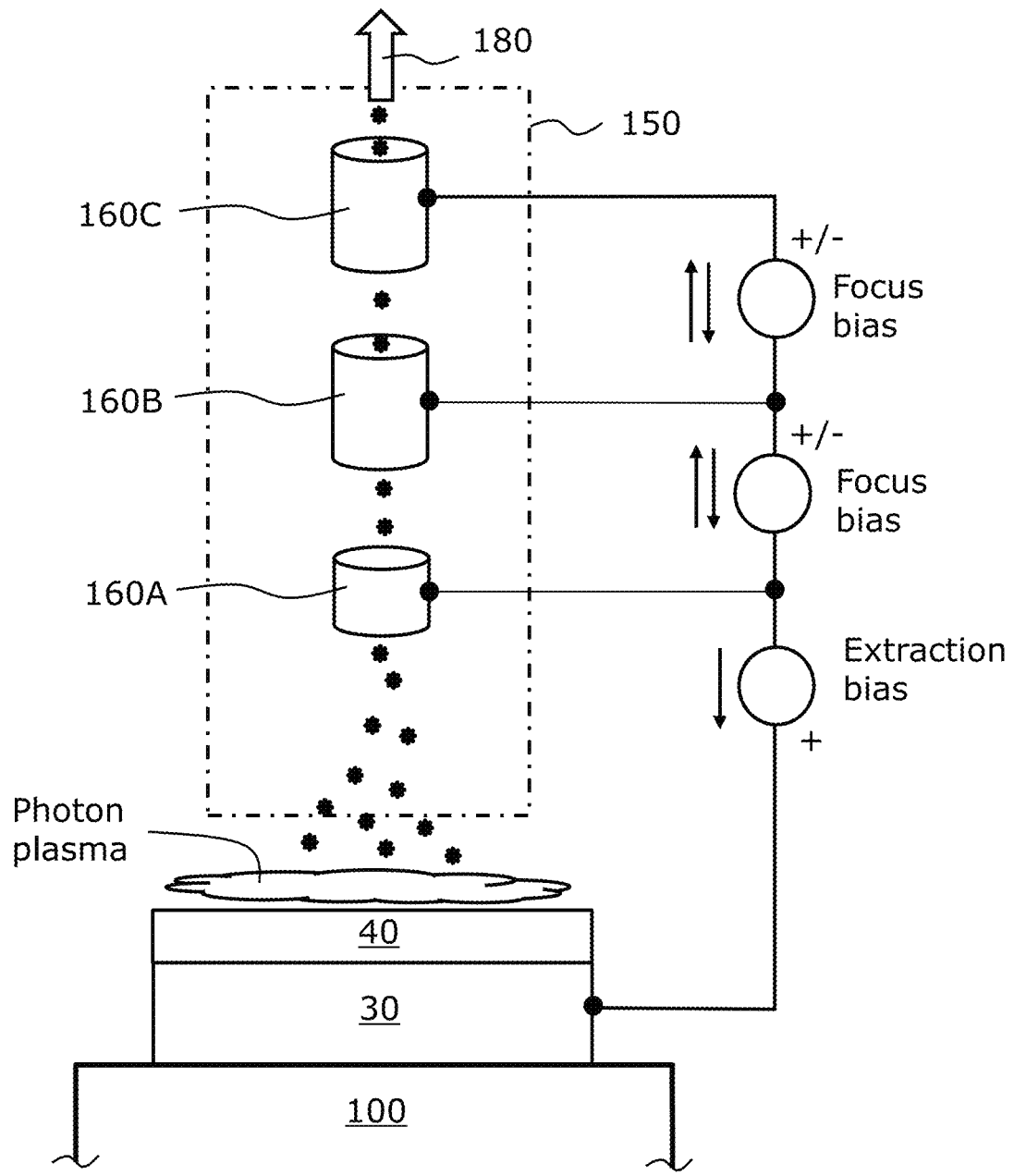
FIG. 3 is a schematic illustration of an example electrode arrangement for use in combination with the planar target of FIG. 2.

Referring next to FIG. 3, there is shown an implementation of the aforesaid electrode arrangement, wherein the electrode arrangement is denoted generally by 150. The electrode arrangement 150 includes one or more annular electrodes 160. For example, a first annular electrode 160A that is spatially nearest the surface layer 40 is configured in operation to be biased negatively relative to the surface layer 40 to attract positrons away from the photon plasma, near the surface layer 40; beneficially, a plane of the first annular electrode 160A is disposed to be substantially parallel to a major plane of the surface layer 40, as illustrated. Optionally, one or more additional annular electrodes 160B, 160C may be positioned more remotely in spatial sequence than the first annular electrode 160A from the surface layer 40, wherein potentials applied to the one or more additional annular electrodes 160B, 160C may be used to form the positron beam 180 generated from the photon plasma to surface layer 40 that is either divergent, collimated or focused to a small area to form a positron probe. The one or more electrodes 160 are beneficially configured so that their annular planes are substantially mutually parallel, and their axes of rotational symmetry are mutually aligned along an optical axis that intersects a region of the surface layer 40 whereat the photon plasma is formed when the positron source 10 is in operation; the one or more electrodes 160 are supported on vacuum-compatible ceramic insulation supports, for example manufactured from machinable ceramic material such as Macor®; Macor® is a composite of mica flakes supported within a borosilicate glass matrix, wherein the borosilicate glass matrix is frangible for machining purposes (for example, diamond milling). Optionally, at least one of the one or more electrodes 160 is implemented as a cylinder. In practice, it is found that the one or more electrodes 160 require bias voltages in an order of kiloVolts to function adequately to collimate or focus the positron beam 180. It will be appreciated that, when the planar target 30 including its associated surface layer 40 are optionally mounted on the rotatable table 100, the electrodes 160 are optionally maintained stationary, wherein the planar target 30 is rotated in operation.

For efficient generation of positrons, it will be further appreciated that the surface layer 40 needs to be kept very clean and beneficially devoid of any surface oxidation or contamination, for example devoid of a native oxide layer of substantially atomic-radius thickness arising by the surface layer 40 being exposed to atmospheric moisture and oxidation before being mounted into the vacuum chamber 20, for example by way of mounting the planar target 30 bearing the surface layer 40 into the vacuum chamber 20. Such an atomic-radius thickness oxide layer tends to react with positrons generated in the photon plasma created above the surface layer 40 when the positron source 10 is in operation. It is thus desirable to sputter away, under vacuum conditions within the vacuum chamber 20, the very thin oxide layer formed on the surface layer 40 before attempting to generate positrons thereat. Beneficially, after the planar target 30 with its associated surface layer 40 has been mounted within the vacuum chamber 20, the pumps 80, 90 are used to pump air out of the vacuum chamber 20 to circa $10^{-2}$ milliBar (namely, to "low vacuum"), and then a trace gas, for example a noble gas, for example including Argon, is released in small quantities into the vacuum chamber 20 and the first electrode 160A is then driven by a radio-frequency generator (not shown) to create a gas plasma, for example an Argon including gas plasma, above the surface layer 40 to at least one of sputter and reactively ion etch away any atomic-radius thick native oxide layer and any organic contamination present on the surface layer 40. The radio-frequency generator is beneficial configured to generate the gas plasma at a radio frequency of a few MegaHertz to a few GigaHertz. Such at least one of sputtering and reactive ion etching has a duration in a range of a few seconds to a few minutes, depending on an intensity of the gas plasma used. Thereafter, the release of the trace gas, for example including Argon, into the vacuum chamber 20 is terminated, and then the pumps 80, 90 are configured to pump the vacuum chamber 20 down to an internal working pressure in a range of $10^{-7}$ to $10^{-11}$ milliBar (namely, "high vacuum"). Removing the native oxide layer and any traces of contamination improves operation of the positron source 10 and its positron yield in the positron beam 180. Optionally, a combination of sputtering and reactive ion etching is used to ensure that the surface layer 40 is stripped of its native oxide and surface contaminants. A composition of the trace gas may be temporally varied during cleaning of the surface layer 40 under vacuum conditions.

Figure 4:
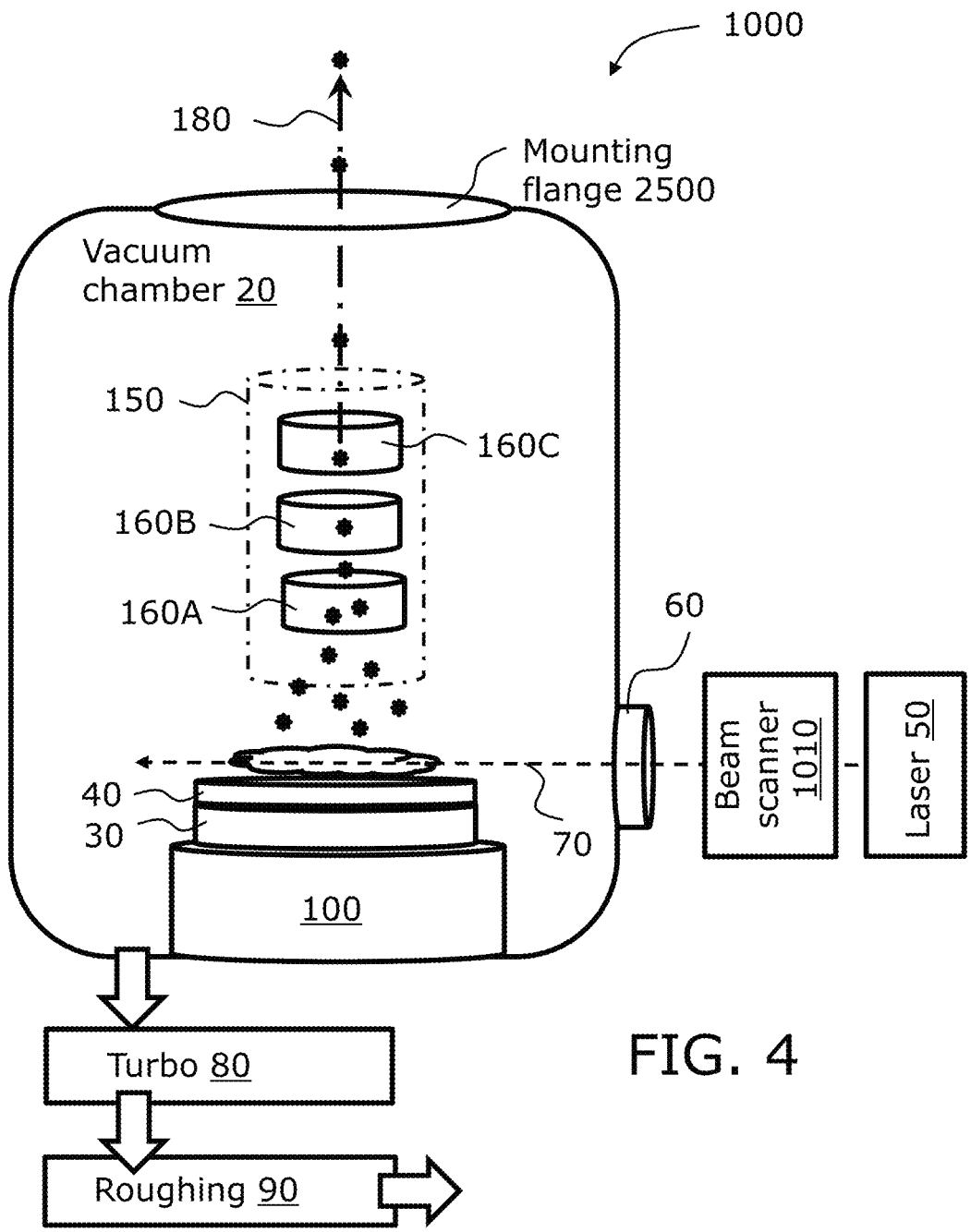
FIG. 4 is a schematic illustration of an alternative positron source of the present disclosure, wherein the positron source uses a scanned laser beam for irradiating a planar target.

Referring to FIG. 4, there is shown an alternative implementation of the positron source indicated generally by 1000. The positron source 1000 is similar to the positron source 10 except that the planar target 30 is stationarily mounted into the vacuum chamber 20, for example onto a metallic wall of the vacuum chamber 20 so that heat generated in the planar target 30 when the positron source 1000 is in operation may be dissipated efficiently away from the planar target 30, to prevent the planar target 30 and its associated surface 40 from overheating. For example, the wall of the vacuum chamber 20 whereat the planar target 30 is mounted may be provided with forced fluid cooling, for example water cooling, through fluid cooling channels formed into channels formed in the wall. Moreover, there is also included a beam scanner 1010 between the laser arrangement 50 and the quartz or fused silica port window 60. The beam scanner 1010 is beneficially implemented using an optical component such as an actuated mirror, diffraction grating or quartz prism; for example, the optical component is mounted when in use on a motor-driven rotatable mount. When the positron source 1000 is in operation, the beam scanner 1010 is used to scan the photon beam 70 over the surface layer 40 of the planar target 30, so that energy dissipated by creating the thermal plasma at the surface layer 40 does not locally damage or ablate the surface layer 40, thereby providing the surface layer 40 with more hours of operation before needing to be replaced. Beneficially, the beam scanner 1010 is operated in a stepwise manner, so that, during an instant of the given laser pulse provided from the laser arrangement 50, the photon beam 70 is maintained substantially stationary in trajectory on the surface layer 40 and then moved to a subsequent trajectory for a subsequent laser pulse. Optionally, high-frequency dithering in spatial position is applied to the photon beam 70 to help to spread the photon plasma at least one of laterally and orthogonally relative to a plane of the surface layer 40. Such dithering may be achieved using a piezo-electric actuator to provide high-frequency vibrations to the optical component, for example in a frequency range of several hundred kilohertz to several MegaHertz.

Figure 5:
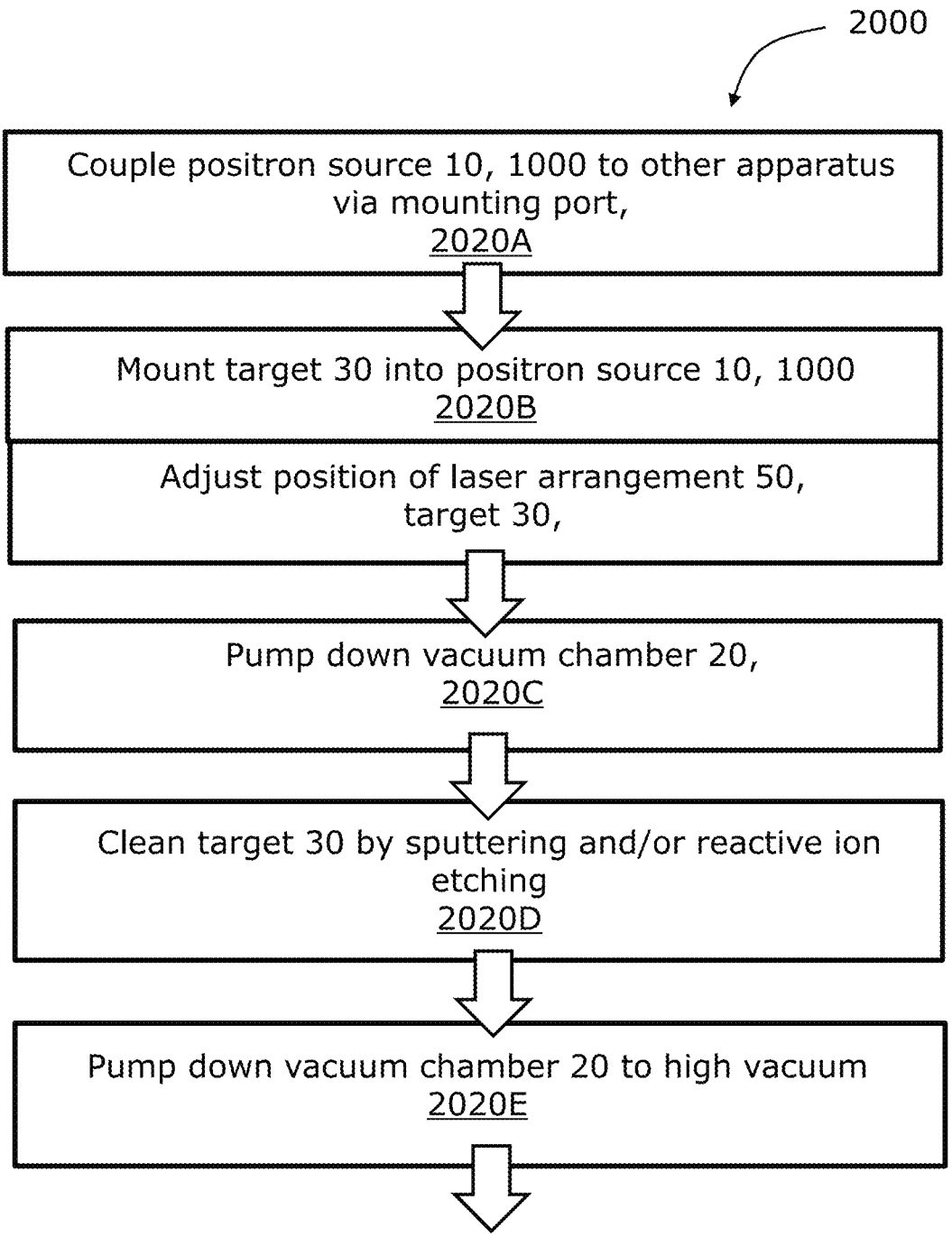
FIG. 5 is an illustration of a flow chart depicting steps of a method for operating the positron source as illustrated in FIGS. 1 to 4.
Figure 5:
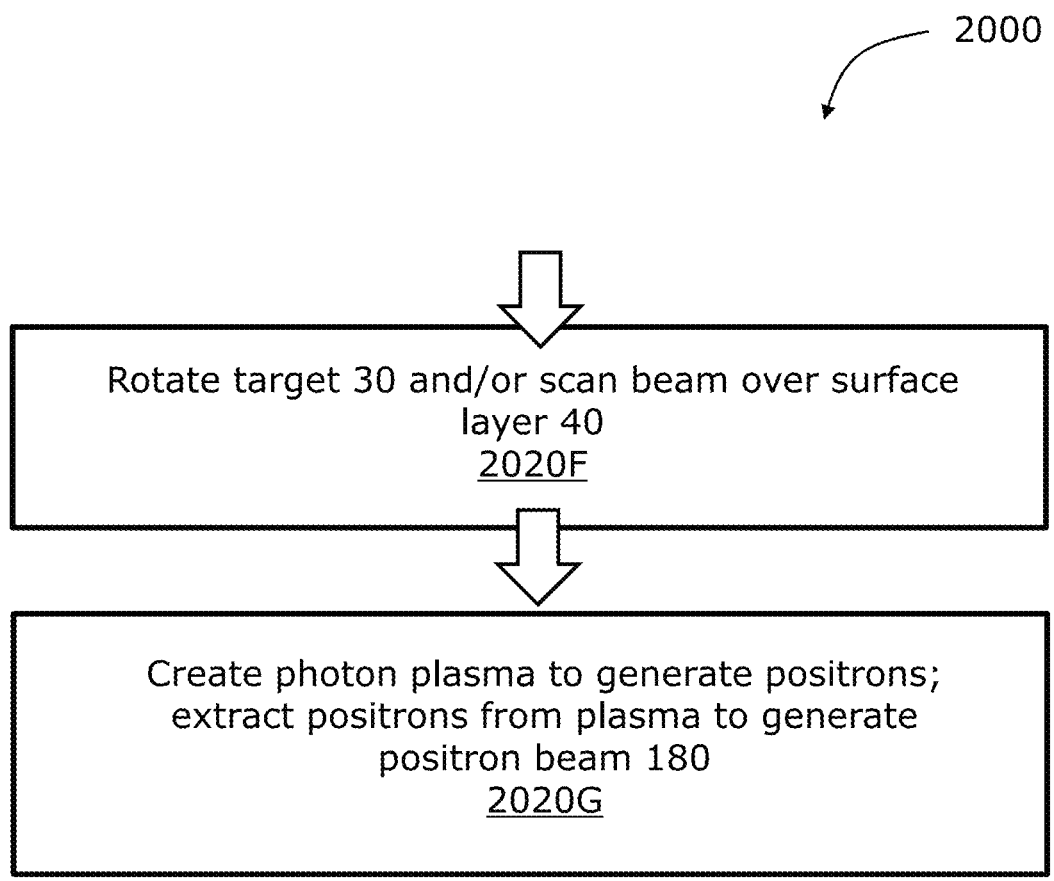

Referring next to FIG. 5, there are shown in a flow chart of steps of a method for (namely, a method of) operating the positron source 10, 1000 as illustrated in FIGS. 1 to 4. The steps are indicated generally by 2000 in FIG. 5. The positron source 10, 1000 beneficially includes a computing device 2010, for example an embedded microcontroller or FPGA logic device, to manage operation of the positron source 10, 1000; the computing device 2010 is configured to execute a software product, for example stored on a data carrier, for implementing the method depicted in FIG. 5.

In a first step 2020A of the method 2000, the positron source 10, 1000 is mechanically coupled, for example by a given user, to other apparatus (not shown) to which the positron source 10, 1000 is to provide the positron beam 180. The other apparatus may, for example, include at least one of: an electron microscope, a positron tomography apparatus, a semiconductor manufacturing apparatus, an energy storage device, a propulsion device. For example, the positron source 10, 1000 may be used to implement precision machining of MEMs structures by way of scanning the positron beam 180 electrostatically in x and y Cartesian ordinate directions to implemented spatially adjustable annihilation ablation of the MEMs structures, for example for tuning mechanically resonant MEMs structures.

In a second step 2020B of the method 2000, the planar target 30 with its surface layer 40 is mounted into the vacuum chamber 20, if not already done prior to the first step 2020A. Optionally, the laser arrangement 50 is activated at a low power to provide the photon beam 70 at a low power to check and adjust a position of at least one of the planar target 30 and the photon beam 70, to ensure that the photon beam 70 propagates as a surface evanescent wave over the surface layer 40, to interact strongly with the surface layer 40. Optionally, at least one of micrometer screw adjusters, piezoelectric actuators, magnetic actuators or similar may be used to make fine mechanical alignment adjustments of the photon beam 70 relative to the surface layer 40.

In a third step 2020C of the method 2000, the pumps 80, 90 are activated to pump the vacuum chamber 20 to at least $10^{-1}$ to $10^{-2}$ milliBar pressure (namely, "low vacuum").

In a fourth step 2020D of the method 2000, optionally, a small amount of a trace gas, for example including a noble gas, for example Argon gas, is released into the vacuum chamber 20 and then a radio frequency signal is applied to the first electrode 160A to generate at least one of a sputtering plasma and a reactive ion etching plasma above the planar target 30 for removing any native oxide layer or contamination on an exposed part of the surface layer 40 of the planar target 30 that is to be used for generating positrons for the positron beam 180.

In a fifth step 2020E of the method 2000, the pumps 80, 90 are configured to pump the vacuum chamber 20 to at least $10^{-7}$ to $10^{-11}$ milliBar pressure (namely, "high vacuum").

In a sixth step 2020F of the method 2000, optionally, the planar target 30 is set in rotation on the rotatable table 100 in the positron source 10. Alternatively, the beam scanner 1010 of the positron source 10 is set into at least one of rotational motion and linear motion to scan the photon beam 70 over the surface layer 40. Optionally, a combination of the rotatable table 100 and the beam scanner 1010 are used when the positron source 10, 1000 is in operation.

In a seventh step 2020G of the method 2000, the laser arrangement 50 is activated to apply photon pulses in the photon beam 70 onto the surface layer 40 of the planar target 30 to generate momentary photon plasma thereat, wherein electrons of the photon plasma are preferentially absorbed at the surface layer 40 to leave an excess of positrons in the photon plasma, wherein the excess positrons are attracted by an electric field generated between the first electrode 160A and the surface layer 40 to be guided by the one or more electrodes 160 to generate the positron beam 180. Beneficially, bias voltages applied to the one or more electrode 160 are adjusted to form the positron beam 180 as required, for example to be divergent, collimated or focused. A position of a focus of the positron beam 180 may be adjusted by suitably varying bias potentials applied to the one or more electrodes 160.

Beneficially, the computing device 2010 is used to implement, at least in part, one or more of the steps 2020A to 2020B, for example via a graphical user interface (GUI) that is used by a given user to set up and adjust the positron source 10, 1000.

In the foregoing, it will be appreciated that the planar target 30 and the surface layer 40 may be optionally integral. Optionally, the surface layer 40 may be formed onto the planar substrate 30, for example by way of using at least one of: epitaxial growth, ion implantation, Graphene sputtering, film spinning, micromachining using at least one of reactive ion etching and anisotropic etching. As aforementioned, the surface layers 40 is beneficially manufactured using a p-type semiconductor material or a nanostructure that functions as a p-type material to capture electrons from a photon plasma.

Figure 6:
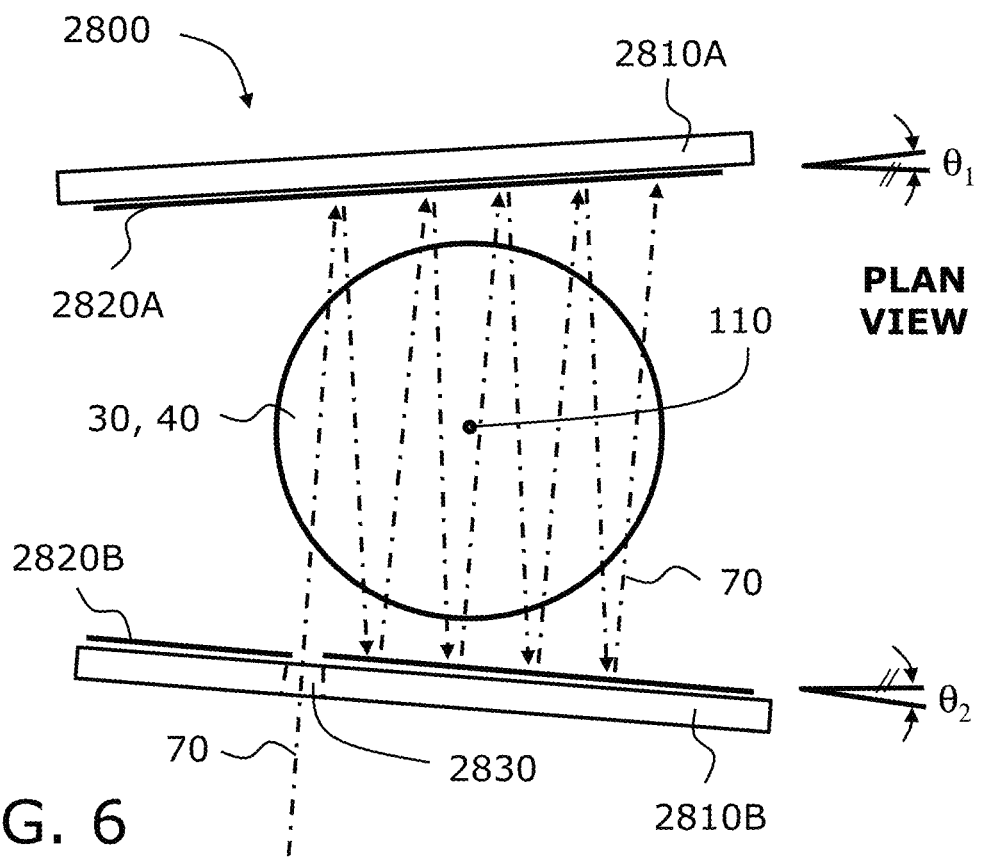
FIG. 6 is an optional configuration of an optional mirror arrangement enhancement for the planar target for use with the positron source of FIGS. 1 to 4 to enhance its yield of positrons.

Referring next to FIG. 6, the planar target 30 and its associated surface layer 40 are optionally provided with a mirror arrangement, indicted generally by 2800, that is configured to cause the photon beam to make multiple traverses across the planar surface 40, to utilize photon energy in pulses of the photon beam 70 to greatest efficiency in generating positrons in the plasma cloud formed in operation close to the planar surface 40. The mirror arrangement 2800 includes a plurality of mirrors that, for example mirrors 2810A and 2810B, that are spaced apart at opposite sides of the planar target 30. The mirrors 2810A, 2810B may be fabricated from quartz plate with mirror coatings 2820A, 2820B respectively; alternatively, the mirrors 2820A, 2820B are fabricated from metal sheets that have been surface polished to a mirror finish. At least one of the mirrors 2810A, 2810B is provided with a hole 2830 or a lack of mirror coating so that, when the positron sources 10, 1000 are in operation, the photon beam 70 is able to enter an optical cavity region between the mirrors 2810A, 2810B whereat the photon beam 70 is reflected back and forth in a zig-zag manner as illustrated. The mirrors 2810A, 2810B are disposed to be slightly mutually non-parallel by an angle $\theta_1+\theta_2$, as illustrated, to provide for the aforesaid zig-zag manner. Such a zig-zag manner of configuration avoids a lasing cavity being formed, wherein the laser beam 70 is concentrated at a particular pair of points on the mirrors 2810A, 2810B. For each reflection of the photon beam 70 between the mirrors 2810A, 2810B, the photon beam 70 beneficially traverses the planar surface 40 as an evanescent wave to interact strongly with the surface layer 40 whilst also generating a photon plasma slightly above the surface layer 40. Optionally, the mirror 2810A, 2810B are mounted on actuators, for example piezoelectric actuators, to be able to adjust the angle $\theta_1+\theta_2$, dynamically during operation of the positron source 10, 1000; such actuation may be used also to precision adjust a height of the photon beam 70 above the surface layer 40, for example to compensate for thermal expansion of the planar target 30 and its surface layer when their positron source 10, 1000 is in operation. The mirrors 2810A, 2810B thereby form a spatially-spread optical cavity around the planar target 30 and its associated surface layer 40. Optionally, the mirror arrangement 2800 of FIG. 6 is augmented to include four mirrors in a rectangular configuration, wherein the four mirrors are configured to be slightly off being mutually orthogonal; in such a configuration, the four mirrors are beneficially mounted on actuators, for example piezoelectric actuators, to dynamically adjust their relative angles, for example to compensate for thermal expansion occurring in the planar substrate 30 and its associated surface layer 40 in operation.

Figure 7:
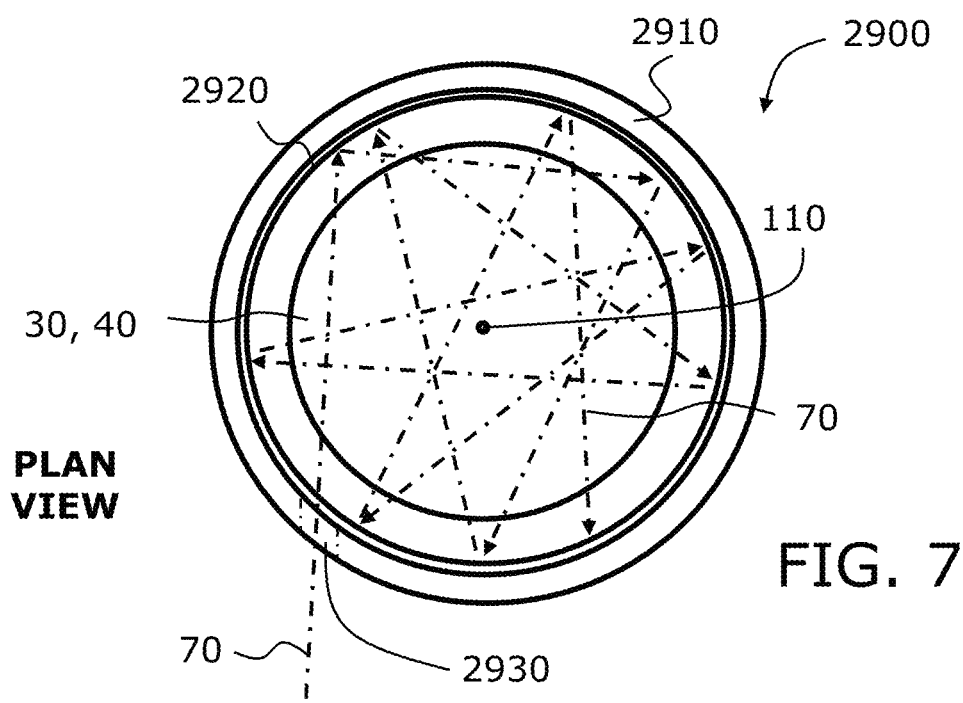
FIG. 7 is an alternative optional configuration of an optional mirror arrangement enhancement for the planar target for use with the positron source of FIGS. 1 to 4 to enhance its yield of positrons.

Referring next to FIG. 7, there is shown an alternative implementation of a mirror arrangement for use in the positron sources 10, 1000; the alternative implementation is indicated generally by 2900. The mirror arrangement 2900 is shown to include a cylindrical mirror 2910, which is circular in plan view. The cylindrical mirror 2910 may be implemented as a cylindrical portion of quartz tube that has a metallic mirror finish 2920 applied to its inside surface, or alternatively as a cylindrical portion of metal tube whose inside surface 2920 has been polished or lapped to a mirror finish. There is also included a hole or portion of transmissive material 2930 through which the photon beam 70 is arranged, for operation of the positron source 10, 1000 to enter into an interior region of the mirror arrangement 2900. As shown, the mirror arrangement 2900 includes the planar target 30 and its associated surface layer 40 within the interior region. The mirror arrangement 2900 is especially beneficial in that the photon beam is spread over and entire surface area of the surface layer 40 and also the mirror arrangement 2900, that maximizes an opportunity for the photon beam 70 to generate positron when interacting with the surface layer 40, and also less ablative stress to the mirror arrangement 2900 compared to the mirror arrangement 2800 of FIG. 6, thereby providing greater longevity of operation before the mirror arrangement 2900 needs to be refurbished or re-coated. Optionally, the mirror arrangement 2900 is mounted on an actuator arrangement (not shown), for example implemented as a piezo-electric actuator, to adjust an angle of inclination in two axes to ensure the photon beam 70 making multiple passes over the surface layer 40 is at an optimum height above the surface layer 40. The mirror arrangement 2900 is beneficially used with the planar target 30 mounted on the rotatable table 100, to rotate when the positron source 10, 1000 is in operation, to ensure to an even greater extent that all areas of the surface layer are used for positron generation.

In practice, the positron source 10, 1000 may be manufactured as a compact assembly that is about a size of a small contemporary domestic refrigerator, such that the positron source 10, 1000 may be included within research laboratories, semiconductor fabrication facilities, medical clinics. Arrays of the positron source 10, 1000 may be configured together to provide a combined positron beam of significant magnitude to generate at least several microgrammes per second of antimatter mass flow rate. The combined positron beam may, for example, be injected, for example, into gaseous Deuterium-Tritium plasma of a fusion reactor, for example a tokamak apparatus such as ITER in Toulouse (France), to assist to heat the gaseous plasma to a condition of thermonuclear ignition.

In developing the optical waveguide array and also the optical waveguide device of the present disclosure, the technical problems associated with using aforesaid radioactive sources undergoing beta decay was very much borne in mind; these problems are addressed by the present disclosure. Moreover, the impracticality of using large particle accelerators and high-Z targets as aforementioned, to yield relatively small quantities of positron, was also borne on mind. It was appreciated that a relative compact and safe apparatus for generating copious quantities of positrons is required by industry and research establishments. Moreover, it was also appreciated that an alternative device for converting photons to electrical energy is required by industry and research establishments.

Figure 8A:
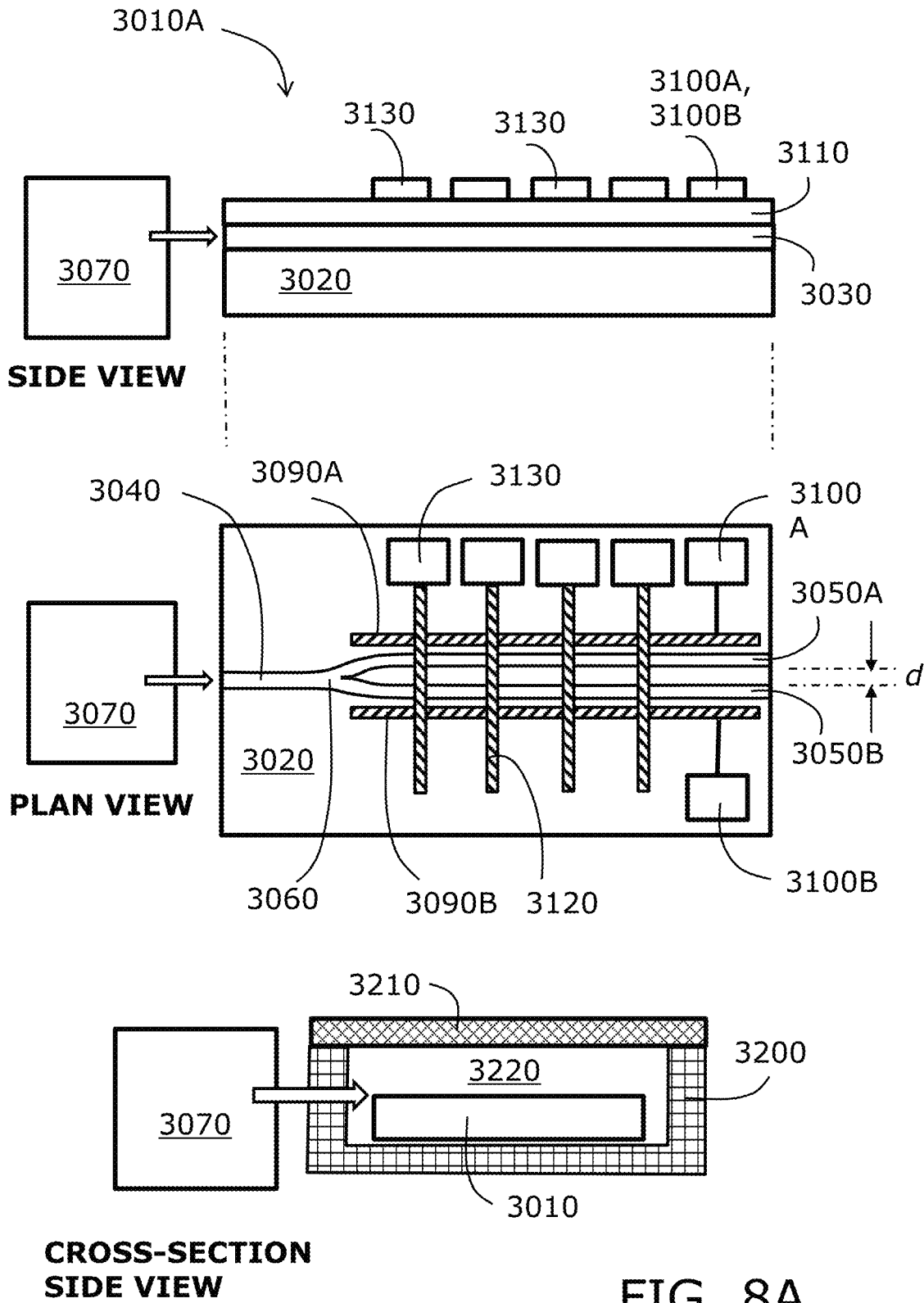
FIG. 8A is a schematic illustration of a simple implementation of an optical waveguide array according to the present disclosure.
Figure 8B:
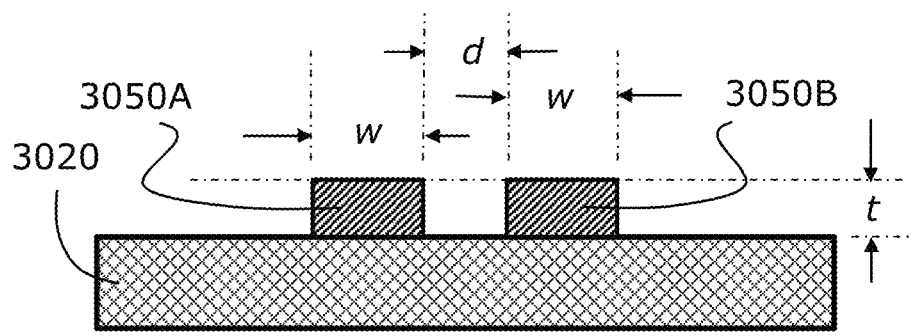
FIG. 8B is a cross-section schematic illustration of two waveguides of the optical waveguide array of FIG. 8A, wherein the waveguides are fabricated to a mutual separation distance "d", a waveguide width "w" and a thick "t"

Referring to FIG. 8A, there are shown a simple example of an optical waveguide array of the present disclosure, wherein the array is indicated generally by 3010A. The array 3010A is fabricated on a fused silica or quartz substrate 3020 on which is grown, for example via vapour-phase deposition, a layer of Lithium Niobate (LiNiO$_3$) 3030 which is configured to exhibit optical non-linearity, for example the Kerr effect as will be described in more detail later; as an alternative to Lithium Niobate, Barium Niobate (BaNiO$_3$) or Graphene may be used. Optionally, the layer of Lithium Niobate 3030 has a thickness in a range of 50 nm to 2.0 μm, namely substantially similar to a wavelength of photons to be propagating along a waveguide structure that is formed by lithographic and etching processes into the layer of Lithium Niobate 3030. The waveguide structure includes an input waveguide 3040 and two complementary waveguides 3050A, 3050B that branch laterally outwards from the input waveguide 3040; the waveguides 3050A, 3050B beneficially have a length in a range of 30 μm to 10 mm, more optionally, the length is in a range of 100 μm to 1 mm, wherein the length determines an efficiency of the array 3010A, when in use, to create a matter-antimatter dipole within the array 3010A, as will be described in greater detail later. A curved interfacing region 3060 of the waveguide structure included between the input waveguide 3040 and the two complementary waveguides 3050A, 3050B beneficially ensures an improved optical matching, to reduce photon reflection back towards a laser arrangement 3070 that is used to provide photons to the array 3010A. The layer of Lithium Niobate 3030 is lithographically formed, as aforementioned, for example by using e-beam or photoresists exposed during a lithographic operation, and by using a dry-etching process, for example reactive lative ion etching; such lithographic forming provides the input waveguide 3040 and the complementary waveguides 3050A, 3050B, as well as the curved interfacing region 3060. A distance "d" between the complementary waveguides 3050A, 3050B is beneficially in a range of 50 nm to 1.0 µm; for example, when the laser arrangement 3070 is configured to provide photons having a wavelength in range of 100 nm to 3 µm, for example substantially 1500 nm wavelength, the complementary waveguides 3050A, 3050B may have a width "w" in a range of 100 nm to 2 µm, for example a width "w" of circa 500 nm and a distance "d" therebetween of substantially 400 nm to 450 nm. The complementary waveguides 3050A, 3050B may have a thickness "t" in a range of 30 nm to 2 µm, as illustrate in FIG. 8B. It will be appreciated that such dimensions may be varied when designing the array 3010A, for example depending the wavelength of the photons provided from the laser arrangement 3070. The laser arrangement 3070 may be a continuous-wave mode laser for configuring the array 3010A to function in a temporally continuous manner; alternatively, the laser arrangement 3070 may be a pulsed mode laser for configuring the array 3010A to function in a pulsed manner; yet alternatively, when in operation, the laser arrangement 3070 is temporally switchable between operating in a continuous mode and a pulsed mode, wherein operation of the array 3010A is varied accordingly.

Two elongate metallic electrodes 3090A, 3090B are provided as illustrated that are disposed with elongate axes substantially parallel to elongate axes of the waveguides 3050A, 3050B, wherein the metallic electrodes 3090A, 3090B are coupled to corresponding electrical wire bonding pads 3100A, 3100B, to which wire bonding may be performed, for making external connections. The metallic electrodes 3090A, 3090B are beneficially fabricated from Titanium, Aluminium, Indium, Silver or similar metal. Optionally, there are provided multiple electrodes 3090 on each outside side of waveguides 3050A, 3050B, wherein the multiple electrodes 3090 are configured both to provide bias electric fields to the waveguides 3050A, 3050B and also to extract electrons from the waveguides 3050A, 3050B. The multiple electrodes at least partially overlay the waveguides 3050A, 3050B, for example for selectively influencing a wave function of photons propagating in operation along the waveguides 3050A, 3050B, to cause selective spatial separation of positrons and electrons generated in the waveguides 3050A, 3050B, by way of non-linear optical effects occurring therein. Such bias electric fields may be arranged in use to induce non-linear optical effects in the waveguides 3050A, 3050B, for example to induce various types of Kerr effect that will be described in greater detail below.

Beneficially, one or more non-linear optical effects that arise include an optical Kerr effect. The optical Kerr effect results in a refractive index change that causes electrons to group with other electrons, and likewise positrons to group with other positrons, resulting in an enhanced positron-electron dipole, and thereby an enhanced acceleration experienced by the electrons and the positrons in a positron source.

Optionally, a further layer of insulator or dielectric, for example a organic polymeric insulating material, alternatively silica ($SiO_2$), namely Silicon Dioxide, 3110 is formed onto the Lithium Niobate layer 3030, and also directly onto the fused silica substrate 3020 in regions where the Lithium Niobate layer 3030 has been removed from the substrate 3020 by etching. A layer of metal, for example Titanium, Aluminium, Indium, Silver or similar metal, is deposited during fabrication onto an exterior surface of the further layer of insulator or dielectric, for example the silica layer 3110, wherein the layer of metal is then lithographically patterned and then etched to provide one or more elongate electrodes 3120 whose one or more corresponding elongate axes are substantially orthogonal to the elongate axes of the waveguides 3050A, 3050B. The one or more elongate electrodes 3120 are terminated at corresponding wire bonding pads 3130. The further layer of insulator or dielectric, for example silica layer 3110, serves to isolate the one or more electrodes 3120 electrically from the multiple electrodes 3090. Optionally, the waveguides 3050A, 3050B have a spatial extent to an edge of the substrate 3020, or even slightly overhanging the substrate 3020, to allow for an electric field to be used in operation to extract positrons away from the waveguides 3050A, 3050B.

As shown in FIG. 8A, the array 3010A is then beneficially mounted to a ceramic module package 3200 that is hermetically sealed using a lid 3210, for example with a region filled inert Argon gas atmosphere or vacuum 3220 therein; wire bonding is beneficially used to connect the aforesaid wire bonding pads 3100, 3130 to connection pins of the ceramic module package 3200. Optionally, the laser arrangement 3070 is also housed within the same ceramic module package 3200 as the array 3010. Alternatively, the laser arrangement 3070 may be housed remotely from the array 3010 and its associated ceramic module package 3200, for example with photons generated in use by the laser arrangement 3070 being coupled via an optical fibre link (not shown) to the array 3010A.

Optionally, the ceramic module package 3200 is operated with a vacuum provided therein, as aforementioned. As shown in FIG. 9, the ceramic module package 3200 is modified in shape, and is further provided with an electrode arrangement 3300 spaced apart from the substrate 3020 to collect or guide positrons ejected from one or more end of the waveguides 3050A, 3050B, to form a positron beam 3340; optionally, an edge of the substrate 3020 extends beyond a mounting ledge of the ceramic module package 3200, as shown in FIG. 9, to allow an intense electric field to be applied in use at the edge of the substrate 3020, in particular to exposed ends of the waveguides 3050A, 3050B. The electrode arrangement 3300 beneficial includes an extraction electrode 3310 disposed nearest to the array 3010, and one or more focusing electrodes 3320 disposed more remotely from the array 3010; the electrodes 3310, 3320 are optionally rotationally symmetrical, namely of a ring-like or cylindrical-like form. Within the ceramic module package 3200, an internal volume is beneficially maintained as a vacuum, for example in a range of $10^{-7}$ to $10^{-11}$ mBar, to avoid annihilation of positrons extracted from the array 3010; optionally, the ceramic module package 3200 is provided with a "getter" therein, as historically used in thermionic vacuum tubes (for example ECC83 or EL34 types) to help to maintain such a high vacuum. Such an arrangement allows for the array 3010 to be used as a positron source for performing positron tomography as well as being used for antimatter research, or even energy storage. However, it will be appreciated that accelerated electrons are beneficially coupled to the elongate electrodes 3090 and then extracted from the ceramic module package 3200, both for configurations as depicted in FIGS. 8A, 8B, 8C and FIG. 9. Such a manner of operation enables the array 3010A to be used as an energy converter, namely converting photon energy into electrical energy. In an optional configuration, at least a part of the converted electrical energy is provided back to the laser arrangement 3070 for reuse to generate photons. The arrangement depicted in FIG. 9 may also be used with a device 3500 of FIG. 10, as will be described below.

The array 3010A beneficially functions by using the Kerr effect, also known as a quadratic electro-optical (QEO) effect. The effect is known to cause positron focusing, for example, as reported in various scientific publications. The Kerr effect is a change in the refractive index of a material in response to an electric field being applied to the material. The Kerr effect is distinct from the Pockels effect in that the induced refractive index change is directly proportional to the square of the applied electric field instead of varying linearly therewith.

There are two special cases of the Kerr effect: (i) DC Kerr effect (electro-optic effect); and (ii) AC Kerr effect (optical Kerr effect). The AC Kerr effect arises when the electric field is due to light itself, causing a refractive index variation that is responsible for nonlinear optical effects of self-focusing, self-phase modulation and modulational instability. This Kerr effect only becomes potentially significant when the array 3010A is used in a pulse mode, when the laser arrangement 3070 is operated in a pulse mode. The DC Kerr effect occurs when light reflected from magnetized material has a slightly rotated plane of polarization.

Figure 8C:
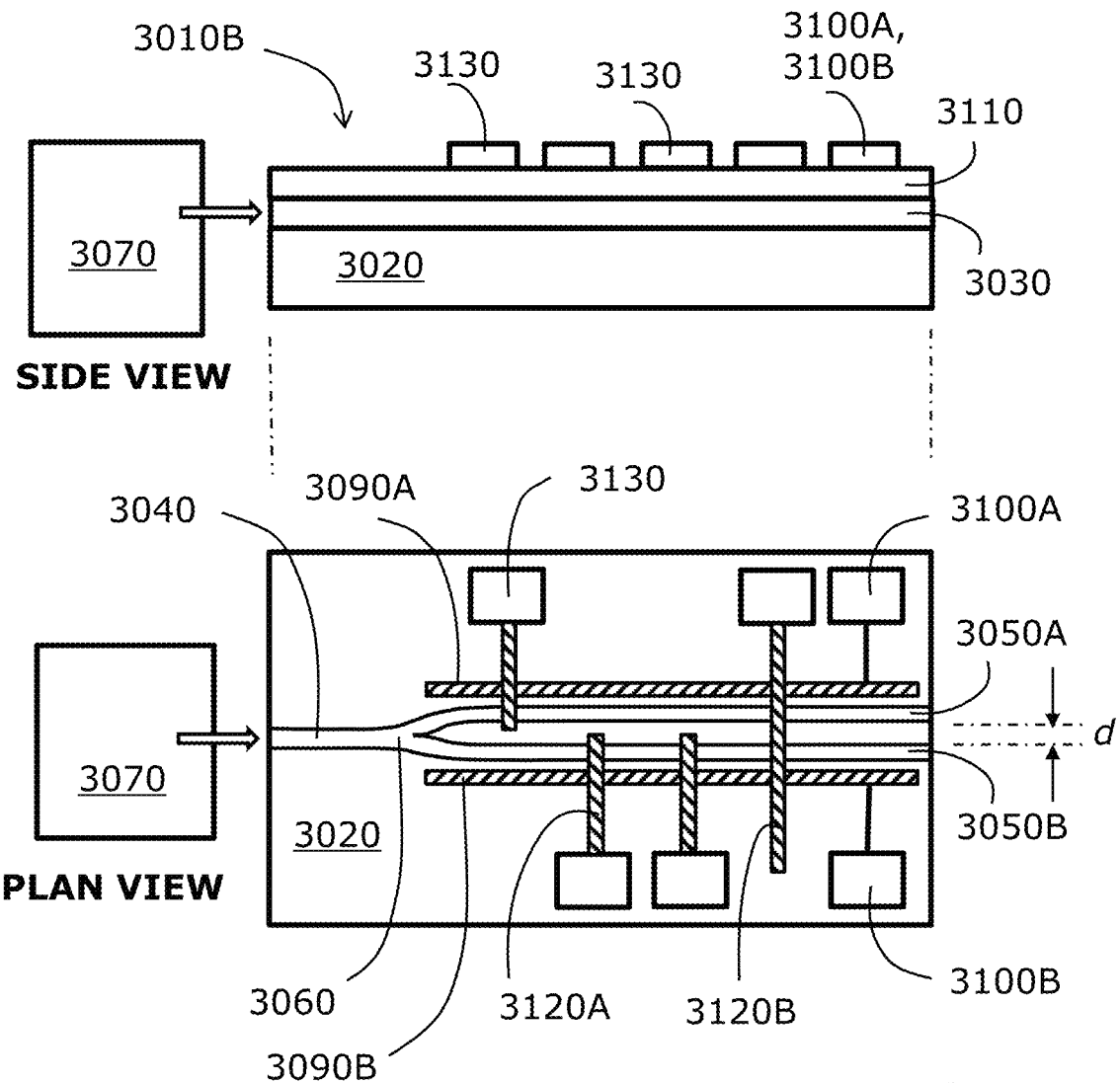
FIG. 8C is a schematic illustration of an alternative simple implementation of an optical waveguide array according to the present disclosure, wherein at least one electrode overlays one of a pair of waveguides for selectively influencing in use a probabilistic wave equation of photons in the waveguide array to control a positron-electron dipole generated in use in the optical waveguide array.
Figure 9:
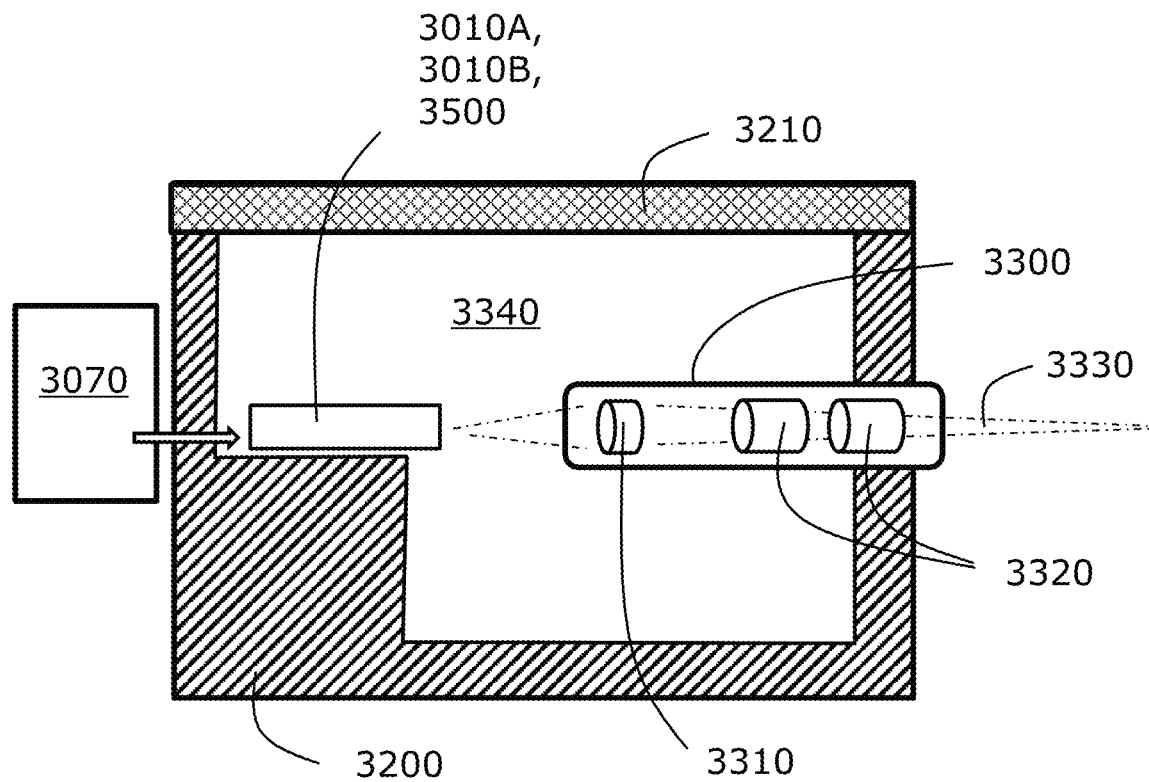
FIG. 9 is a schematic illustration of the optical waveguide array of FIGS. 8A, 8B, 8C configured to include a positron extraction arrangement.

In FIG. 8C, an array is indicated generally by 3010B. The array 3010B is similar to the array 3010A, except that at least one of the electrodes 3120A overlays only one of the pair of waveguides 3050A, 3050B, whereas at least one of the electrodes 3120B overlays both of the pair of waveguides 3050A, 3050B. Such a configuration of electrodes 3120A, 3120B allows for more precise control of wavefunctions describing photons propagating in use in the waveguides, to assist more efficient generation of an electron-positron dipole within the waveguides 3050A, 3050B. As aforementioned, a wave function describing a given photon propagating in the waveguides 3050A, 3050B. has a spatial extent that includes both of the waveguides 3050A, 3050B, wherein the aforesaid non-linear optical effect causes an electron and a positron of the given photon to exhibit a differential Schrödinger-Heisenberg probability of being present in the waveguides 3050A, 3050B, thereby creating the aforesaid matter-antimatter dipole.

Beneficially, the optical Kerr effect, for example the electro-optic effect, is used in implementations of the present disclosure. The optical Kerr effect results in a refractive index change that causes electrons to group with other electrons, and likewise positrons to group with other positrons, resulting in an enhanced positron-electron dipole, and thereby an enhanced acceleration experienced by the electrons and the positrons in the positron source.

In operation, photons are generated by the laser arrangement 3070 that propagate to the substrate 3020 and are injected into the input waveguide 40. The photons propagate along the input waveguide 3040 to the curved interfacing region 3060 which is spatially progressively influenced by the Kerr effect; optionally, the Kerr effect is modulated from one or more of the electrodes 3090, 3120 being biased by applying bias voltages thereto. The Kerr effect results in more electrons of the photons being diverted to a given elongate waveguide 3050, for example the waveguide 3050A, relative to the other elongate waveguide 3050, for example the waveguide 3050B. On account of the elongate waveguides 3050A, 3050B mutually spatially close together, a (Schrödinger) equation wavefunction describing the photons remains coherent and excess positrons generated in one of the two waveguide 3050 do not annihilate with positive matter forming the waveguide 3050. In FIG. 9, when such positrons are extracted from the one of the waveguides 3050, for example by biasing a positron extraction arrangement 3095 of extraction electrodes to be negatively biased relative to the substrate 3020 and its associated electrodes 3090, 3120; the positrons enter vacuum and their corresponding photon wavefunctions then collapse into decoherence in the elongate waveguides 3050A, 3050B.

For conserving energy when operating the array 3010, both the laser arrangement 3070 and bias voltages applied to at least a subset of the electrodes 3090, 3120 may be applied as a series of temporal pulses; beneficially, the applied temporal pulses are mutually synchronized, for example with a phase delay included therebetween to cope with propagation delays of photons between the laser arrangement 3070 and the array 3010.

It will be appreciated that an excess of electrons in one of the elongate waveguides 3050, for example the waveguide 3050A, and an excess of positrons in another of the elongate waveguides 3050, for example the waveguide 3050B, causes a matter-antimatter dipole to be formed within the array 3010A, 3010B that is effective to accelerate to electrons relative to the positrons. The electrodes 3120 may optionally be used to spatially confine the positrons whilst their corresponding electrons are accelerated along their waveguide 3050 and coupled to their responding spatially closely-disposed elongate electrode 3090. In operation, the electrons appear to gain energy from interacting with the positrons, which is manifested at a significant voltage being output from the elongate electrode 3090, for example, in an order of several eV at least.

Referring next to FIG. 10, in order to achieve a greater performance, a plurality of at least one of the arrays 3010A, 3010B as depicted in FIG. 9 may be disposed on the substrate 3020 in a spatially cascaded configuration, as illustrated in FIG. 10. Such a cascaded configuration enables multiple matter-antimatter dipoles to be formed of progressively greater magnitude that contributes to an improved efficiency of operation of the substrate 3020 and its associated components. As a result, a yield of at least one of accelerated electrons and positrons generated from the substrate 3020 may be considerably enhanced.

In FIG. 10, there is shown a waveguide arrangement apparatus indicated generally by 3500, wherein ends of waveguides 3050A, 3050B of a given array 3010A, 3010B are routed to corresponding input waveguides 3040 of a subsequent array 3010A, 3010B as illustrated; the arrays 3010A, 3010B are mutually fabricated together on the substrate 3020. There are beneficially at least two cascaded arrays 3010A, 3010B in a given series in the waveguide arrangement apparatus 3500. The number of cascaded arrays 3010A, 3010B is determined by coherence of photons that may be achieved in use. In FIG. 10, each array 3010A, 3010B is provided with its corresponding electrodes 3090, 3120, wherein the electrodes 3090, 3120 are routed via a signal processing arrangement 3510 to a control arrangement 3520 implemented using at least one of a RISC processor, a field-programmable gate array (FPGA) or similar. The control arrangement 3520 is configured to execute one or more software products stored on a data storage medium to control operation. The signal processing 3530 is configured to provide an output signal, for example an output voltage of appreciable power.

The waveguide arrangement apparatus 3500 may be configured as an energy generating device, for example when photons for the waveguide arrangement are provided from an external source, for example a solar collector, but not limited thereto.

Beneficially, the array 3010A, 3010B and the array arrangement apparatus 3500 may be disposed in large array facilities, for example in solar arrays, for generating large amounts of electrical energy. Alternatively, the array 3010A, 3010B and the array arrangement apparatus 3500 may be implemented in miniaturized form and included in portable electronic apparatus, for example portable computers, smartphones, drones, satellites, space probes and such like.

Figure 11:
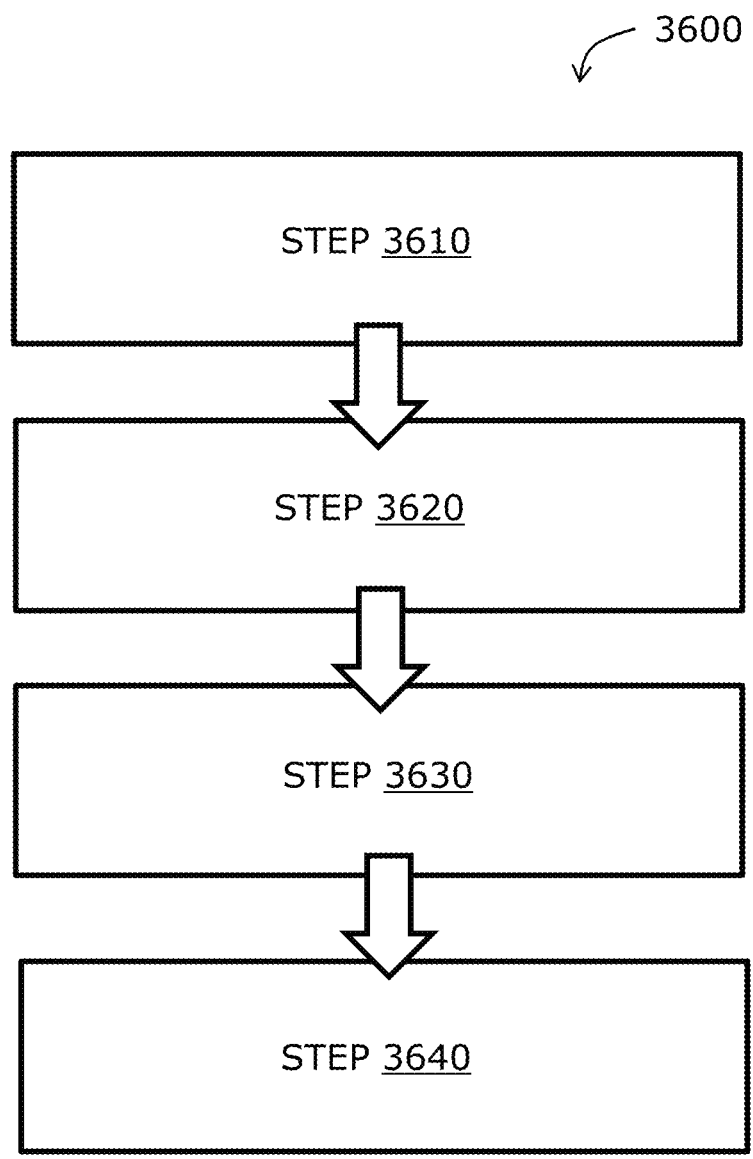
FIG. 11 is a flow chart depicting steps of a method for operating the optical waveguide array and optical waveguide apparatus of any one of FIGS. 8A, 8B, 8C, 9 and 10.

Referring next to FIG. 11, there are shown steps of a method for (namely, a method of) operating the array 3010A, 3010B and, mutatis mutandis, the array arrangement apparatus 3500; a flowchart of the method is indicated generally by 3600. The method 3600 for operating the optical waveguide array 3010A, 3010B and the optical waveguide array apparatus 3500 includes steps 3610 to 3640.

The step 3610 includes arranging for the at least one waveguide structure, for example including the waveguides 3040, 3050A, 3050B, 3060, to be fabricated at least in part from a material that exhibits one or more non-linear optical effects when in use.

The step 3620 includes configuring an electrode arrangement, for example including the electrodes 3090, 3120, to control the one or more non-linear optical effects and to extract at least one of accelerated electrons and positrons from the at least one waveguide structure.

The step 3630 includes configuring the optical waveguide array 3010A, 3010B or the optical waveguide array apparatus 3500, when in use, to separate photons input on the at least one waveguide structure using the one or more non-linear optical effects into their respective electrons and positrons.

The step 3640 includes guiding the respective electrons and positrons into their respective regions of the at least one waveguide structure to cause a matter-antimatter dipole to be formed within the at least one waveguide structure waveguide structure for imparting energy to at least one of the electrons and the positrons to cause acceleration thereof, for example for generating the positron beam 3330.

It is to be understood that arrangements of components illustrated in the aforesaid diagrams and described above are exemplary and that other arrangements may be possible within the scope of the claims as appended herewith. Although the disclosure and its advantages have been described in detail, it is to be understood that various changes, substitutions, and alterations may be made herein without departing from the spirit and scope of the disclosure as defined by the appended claims.

STATEMENTS

Statement 1: A positron source (10; 1000) for generating a positron beam (180), wherein the positron source (10; 1000) includes:
  a laser arrangement (50) configured to generate a beam (70) of photons;
  a target (30) configured to receive the beam (70) of photons, wherein the target (30) is arranged for the photons of the beam (70) to generate a photon plasma at a surface layer (40) of the target (30), wherein the surface layer (40) is configured to preferentially absorb electrons from the photon plasma to generate corresponding free positrons; and
  an electrode arrangement (160) comprising one or more electrodes (160A, 160B, 160C) that are configured to apply an electric field to the photon plasma to extract the free positrons therefrom and to guide the positrons to form the positron beam (180);
  wherein at least the target (30) and the electrode arrangement (160) are included within a vacuum chamber (20) configured in use to provide a vacuum condition in which the target (30) and the electrode arrangement (160) are arranged to function.

Statement 2: A positron source (10; 1000) of Statement 1, wherein the surface layer (40) is configured to include a doped semiconductor material for providing the surface layer (40).

Statement 3: A positron source (10; 1000) of Statement 2, wherein the doped semiconductor includes at least one of: p-doped Silicon, p-doped Gallium Arsenide, p-doped Graphene, Graphene, p-doped Silicon Carbide.

Statement 4: A positron source (10; 1000) of Statement 1, 2 or 3, wherein the positron source (10; 1000) is configured for the beam (70) of photons to propagate in a direction that is substantially parallel to a plane of the surface layer (40) when the beam (70) of photons is received at the surface layer (40) for generating the photon plasma.

Statement 5: A positron source (10; 1000) of Statement 4, wherein the beam (70) of photons is arranged to propagate as an evanescent wave over the surface layer (40) when generating the photon plasma.

Statement 6: A positron source (10; 1000) of any one of the preceding Statements, wherein the target (30) is supported on a rotatable table (100) that is arranged to rotate when the positron source (10; 1000) is in operation, to increase an area of the surface layer (40) that is exposed to the beam (70) of photons.

Statement 7: A positron source (10; 1000) of any one of the preceding Statements, wherein the positron source (10; 1000) further includes a beam scanner (1010) for scanning the beam (70) of photons over the surface layer (40) when the positron source (10; 1000) is in operation, to increase an area of the surface layer (40) that is exposed to the beam (70) of photons.

Statement 8: A positron source (10; 1000) of Statement 7, wherein the beam scanner (1010) is implemented as an actuated or rotatable mirror, prism or diffraction grating.

Statement 9: A positron source (10; 1000) of any one of the preceding Statements, wherein the electrode arrangement (160) is configured to remove a native oxide of the surface layer (40) prior to the surface layer (40) being configured to interact with the photon plasma to generate positrons, wherein the electrode arrangement (160) is configured to be driven by a radio-frequency signal to excite a trace gas introduced into the vacuum chamber (20) to cause sputtering or reactive ion etching at the surface layer (40).

Statement 10: A positron source (10; 1000) of any one of the preceding Statements, wherein the laser arrangement (50) is configured to generate the beam (70) of photons as a pulsed photon beam.

Statement 11: A positron source (10; 1000) of Statement 10, wherein the pulsed photon beam has a pulse energy in a range of 10 milliJoules to 1 Joule per pulse, and a pulse duration in a range of 10 picoSeconds to 100 nanoSeconds.

Statement 12: A positron source (10; 1000) of any one of the preceding Statements, wherein the laser arrangement (50) is configured to generate the beam (70) of photons to have a radiation wavelength in a range of 2 μm to 50 nm.

Statement 13: A positron source (10; 1000) of any one of the preceding Statements, wherein the positron source (10;

1000) is configured to move the beam (70) or photons in a step-wise manner over the surface layer (40), wherein the beam (70) of photons at the surface layer (40) is substantially stationary at an instance that a pulse of photons is output from the laser arrangement (50).

Statement 14: A positron source (10; 1000) of any one of the preceding Statements, wherein the electrode arrangement (160) further includes a first electrode (160A) for generating an electric field to extract positrons from the photon plasma, and one or more second electrodes (160B, 160C) for forming the positron beam (180) to be at least one of: divergent, collimated, convergent.

Statement 15: A positron source (10; 1000) of any one of the preceding Statements, wherein the positron source (10; 1000) is configured for use with at least one of: an electron microscope, a positron tomography apparatus, a semiconductor manufacturing apparatus, an energy storage device, a propulsion device.

Statement 16: A positron source (10; 1000) of any one of the preceding Statements, wherein the positron source (10; 1000) is configured to include a mirror arrangement (2800; 2900) for guiding the photon beam (70) to make multiple passes over the surface layer (40) in use, to enhance a yield of positrons generated at the surface layer (40) for a given pulse energy of the photon beam (70).

Statement 17: A method for operating a positron source (10; 1000) for generating a positron beam (180) therefrom, wherein the positron source (10; 1000) includes:
- a laser arrangement (50) configured to generate a beam (70) of photons;
- a target (30) configured to receive the beam (70) of photons;
- an electrode arrangement (160) comprising one or more electrodes (160A, 160B, 160C);
- wherein at least the target (30) and the electrode arrangement (160) are included within a vacuum chamber (20);
- wherein the method includes:
- configuring the vacuum chamber (20) in use to provide a vacuum condition in which at least the target (30) and the electrode arrangement (160) are arranged to function;
- configuring the positron source (10; 1000) for the photons of the beam (70) to generate a photon plasma at a surface layer (40) of the target (30), wherein the surface layer (40) is configured to preferentially absorb electrons from the photon plasma to generate corresponding free positrons; and
- configuring the one or more electrodes (160A, 160B, 160C) to apply an electric field to the photon plasma to extract the free positrons therefrom and to guide the positrons to form the positron beam (180).

Statement 18: A method of Statement 17, wherein the method includes configuring the surface layer (40) to include a doped semiconductor material for providing the surface layer (40).

Statement 19: A method of Statement 18, wherein the doped semiconductor includes at least one of: p-doped Silicon, p-doped Gallium Arsenide, p-doped Graphene.

Statement 20: A method of Statement 17, 18 or 19, wherein the method includes configuring the positron source (10; 1000) for the beam (70) of photons to propagate in a direction that is substantially parallel to a plane of the surface layer (40) when the beam (70) of photons is received at the surface layer (40) for generating the photon plasma.

Statement 21: A method of Statement 20, wherein the method includes arranging for the beam (70) of photons to propagate as an evanescent wave over the surface layer (40) when generating the photon plasma.

Statement 22: A method of any one of Statements 17 to 21, wherein the method includes supporting the target (30) on a rotatable table (100) that is arranged to rotate when the positron source (10; 1000) is in operation, to increase an area of the surface layer (40) that is exposed to the beam (70) of photons.

Statement 23: A method of any one of Statements 17 to 22, wherein the method includes arranging for the positron source (10; 1000) to further include a beam scanner (1010) for scanning the beam (70) of photons over the surface layer (40) when the positron source (10; 1000) is in operation, to increase an area of the surface layer (40) that is exposed to the beam (70) of photons.

Statement 24: A method of Statement 23, wherein the method includes implementing the beam scanner (1010) as an actuated or rotatable mirror, prism or diffraction grating.

Statement 25: A method of any one of Statements 17 to 24, wherein the method includes configuring the electrode arrangement (160) to remove a native oxide of the surface layer (40) prior to the surface layer (40) being configured to interact with the photon plasma to generate positrons, wherein the electrode arrangement (160) is configured to be driven by a radio-frequency signal to excite a trace gas introduced into the vacuum chamber (20) to cause sputtering or reactive ion etching at the surface layer (40).

Statement 26: A method of any one of Statements 17 to 25, wherein the method includes configuring the laser arrangement (50) to generate the beam (70) of photons as a pulsed photon beam.

Statement 27: A method of Statement 26, wherein the method includes arranging for the pulsed photon beam to have a pulse energy in a range of 10 milliJoules to 1 Joule per pulse, and a pulse duration in a range of 10 picoSeconds to 100 nanoSeconds.

Statement 28: A method of any one of Statements 17 to 27, wherein the method includes configuring the laser arrangement (50) to generate the beam (70) of photons to have a radiation wavelength in a range of 2 μm to 50 nm.

Statement 29: A method of any one of Statements 17 to 28, wherein the method includes configuring the positron source (10; 1000) to move the beam (70) or photons in a step-wise manner over the surface layer (40), wherein the beam (70) of photons at the surface layer (40) is substantially stationary at an instance that a pulse of photons is output from the laser arrangement (50).

Statement 30: A method of any one of Statements 17 to 29, wherein the method further includes configuring the electrode arrangement (160) to include a first electrode (160A) for generating an electric field to extract positrons from the photon plasma, and one or more second electrodes (160B, 160C) for forming the positron beam (180) to be at least one of: divergent, collimated, convergent.

Statement 31: A method of any one of Statements 17 to 30, wherein the method includes configuring the positron source (10; 1000) for use with at least one of: an electron microscope, a positron tomography apparatus, a semiconductor manufacturing apparatus, an energy storage device, a propulsion device.

Statement 32: A method of any one of Statements 17 to 31, wherein the method includes configuring the positron source (10; 1000) to include a mirror arrangement (2800; 2900) for guiding the photon beam (70) to make multiple passes over the surface layer (40) is use, to enhance a yield of positrons generated at the surface layer (40) for a given pulse energy of the photon beam (70).

Statement 33: A software product stored on a machine-readable data carrier, wherein the software product is executable on computing hardware (2010) to implement a method of any one of Statements 17 to 32.

Statement 35: A positron source (3010A; 3010B; 3500) for generating a positron beam (3330), wherein the positron source (3010A; 3010B, 3500) includes an optical waveguide array device (3010A; 3010B; 3500) including a substrate (3020), and at least one waveguide structure (4300, 3050A, 3050B, 3060) formed onto the substrate (3020), wherein the at least one waveguide structure (3040, 3050A, 3050B, 3060) is fabricated at least in part from a material that exhibits one or more non-linear optical effects when in use, and an electrode arrangement (3090, 3120) configured to control the one or more non-linear optical effects and to extract at least one of accelerated electrons and positrons from the at least one waveguide structure (3040, 3050A, 3050B, 3060), and wherein the optical waveguide array device (3010A; 3010B; 3500) is configured in use to separate photons input on the at least one waveguide structure (3040, 3050A, 3050B, 3060) using the one or more non-linear optical effects into their respective electrons and positrons, and to guide the respective electrons and positrons into their respective regions of the at least one waveguide structure (3040, 3050A, 3050B, 3060) to cause a matter-antimatter dipole to be formed within the at least one waveguide structure waveguide structure (3040, 3050A, 3050B, 3060) for imparting energy to at least one of the electrons and the photons to cause acceleration thereof, wherein the positrons are extracted to generate the positron beam (3330).

Statement 36: A positron source (3010A; 3010B; 3500) of Statement 35, wherein the substrate (3020) is fabricated from a dielectric material, and the material of the at least one waveguide structure (3040, 3050A, 3050B, 3060) includes at least one of: Lithium Niobate (LiNiO$_3$), Barium Niobate (BaNiO$_3$), Graphene.

Statement 37: A positron source (3010A; 3010B; 3500) of Statement 35 or 36, wherein the substrate (3020) is fabricated from a dielectric material, optionally at least one of: quartz, fused silica.

Statement 38: A positron source (3010A; 3010B; 3500) of Statement 35, 36 or 37, wherein the electrode arrangement (3090, 3120) comprises a configuration of electrodes (3090, 3120) whose elongate axes are configured to be substantially parallel to, or substantially orthogonal to, elongate axes of a plurality elongate waveguides (3050A, 3050B) into which the corresponding electrons and positrons are selectively diverted when the device (3010A; 3010B; 3500) is in operation.

Statement 39: A positron source (3010A; 3010B; 3500) of Statement 38, wherein the electrode arrangement (3090, 3120) is fabricated from at least one of: Titanium, Aluminium, Indium, Silver.

Statement 40: A positron source (3010A; 3010B; 3500) of any one of Statements 35 to 39, wherein the device (3010A; 3010B; 3500) includes a plurality of the at least one waveguide structure (3040, 3050A, 3050B, 3060) arranged in a cascaded configuration.

Statement 41: A positron source (3010A; 3010B; 3500) of any one of Statements 35 to 40, wherein the device (3010A; 3010B; 3500) further includes a laser arrangement (3070) configured in use to provide photons to the at least one waveguide structure (3040, 3050A, 3050B, 3060).

Statement 42: A positron source (3010; 3500) of Statement 41, wherein the laser arrangement (3070) is configured to function in at least one of: a continuous mode, a pulsed mode, a combination of continuous and pulsed modes.

Statement 43: A positron source (3010A; 3010B; 3500) of any one of Statements 35 to 42, wherein waveguides of the at least one waveguide structure (3040, 3050A, 3050B, 3060) are disposed in a parallel mutually spaced-apart manner with a distance (d) therebetween, wherein the distance is substantially of a similar size to a wavelength of the photons supplied to the at least one waveguide structure (3040, 3050A, 3050B, 3060) when in operation.

Statement 44: A positron source (3010A; 3010B; 3500) of Statement 43, wherein the distance (d) is configured to allow for photon coherence to be maintained between mutually adjacent elongate waveguides (3050A, 3050B) of the at least one waveguide structure (3040, 3050A, 3050B, 3060).

Statement 45: A method (3600) for operating a positron source (3010A; 3010B; 3500) to generate a positron beam (3330), wherein the positron source (3010A; 3010B; 3500) includes an optical waveguide array device (3010A; 3010B; 3500) including a substrate (3020), and at least one waveguide structure (3040, 3050A, 3050B, 3060) formed onto the substrate (3020), wherein the method (3600) includes:

(i) arranging for the at least one waveguide structure (3040, 3050A, 3050B, 3060) to be fabricated at least in part from a material that exhibits one or more non-linear optical effects when in use;

(ii) optionally configuring an electrode arrangement (3090, 3120) to control the one or more non-linear optical effects and to extract at least one of accelerated electrons and positrons from the at least one waveguide structure (3040, 3050A, 3050B, 3060);

(iii) configuring the optical waveguide array device (3010A; 3010B; 3500), when in use, to separate photons input on the at least one waveguide structure (3040, 3050A, 3050B, 3060) using the one or more non-linear optical effects into their respective electrons and positrons; and (iv) guiding the respective electrons and positrons into their respective regions of the at least one waveguide structure (3040, 3050A, 3050B, 3060) to cause a matter-antimatter dipole to be formed within the at least one waveguide structure waveguide structure (3040, 3050A, 3050B, 3060) for imparting energy to at least one of the electrons and the positrons to cause acceleration thereof, wherein the method further comprises extracting the positrons to form the positron beam (3330).

Statement 46: A method (3600) of Statement 45, wherein the method (3600) includes fabricating the substrate (3020) from a dielectric material, and arranging for the material of the at least one waveguide structure (3040, 3050A, 3050B, 3060) to include at least one of: Lithium Niobate (LiNiO$_3$), Barium Niobate (LiNiO$_3$), Graphene.

Statement 47: A method (3600) of Statement 45 or 46, wherein the method (3600) includes fabricating the substrate (3020) from a dielectric material, optionally at least one of: quartz, fused silica.

Statement 48: A method (3600) of Statement 45, 46 or 47, wherein the electrode arrangement (3090, 3120) comprises a configuration of electrodes whose elongate axes are configured to be substantially parallel to, or substantially orthogonal to, elongate axes of a plurality elongate waveguides (3050A, 3050B) into which the corresponding electrons and positrons are selectively diverted when the device (3010A; 3010B; 3500) is in operation.

Statement 49: A method (3600) of Statement 48, wherein the electrode arrangement (3090, 3120) is fabricated from at least one of: Titanium, Aluminium, Indium, Silver.

Statement 50: A method (3600) of any one of the preceding Statements 45 to 49, wherein the method (3600) includes arranging for the device (3010A; 3010B; 3500) to include a plurality of the at least one waveguide structure (3040, 3050A, 3050B, 3060) arranged in a cascaded configuration.

Statement 51: A method (3600) of any one of the preceding Statement 45 to 50, wherein the method (3600) further includes arranging for the device (3010A; 3010B; 3500) to further include a laser arrangement (3070) configured in use to provide photons to the at least one waveguide structure (3040, 3050A, 3050B, 3060).

Statement 52: A method (3600) of Statement 51, wherein the method (3600) includes configuring the laser arrangement (3070) to function in at least one of: a continuous mode, a pulsed mode, a combination of continuous and pulsed modes.

Statement 53: A method (3600) of any one of the preceding Statements 45 to 52, wherein the method (3600) includes arranging for waveguides of the at least one waveguide structure (3040, 3050A, 3050B, 3060) to be disposed in a parallel mutually-spaced-apart manner with a distance (d) therebetween, wherein the distance is substantially of a similar size to a wavelength of the photons supplied to the at least one waveguide structure (3040, 3050A, 3050B, 3060) when in operation.

Statement 54: A method (3600) of Statement 53, wherein the method (3600) includes configuring the distance (d) to allow for photon coherence to be maintained between mutually adjacent elongate waveguides (3050A, 3050B) of the at least one waveguide structure (3040, 3050A, 3050B, 3060).

Statement 55: A software product recorded on a machine-readable data carrier, wherein the software product is executable on computing hardware (3520) of the device (3010A; 3010B; 3500) of any one of Statements 35 to 44, to implement a method as claimed in any one of Statements 45 to 54.

I claim:

1. A positron source for generating a positron beam, wherein the positron source includes:
   a laser arrangement configured to generate a beam of photons;
   a target configured to receive the beam of photons, wherein the target is arranged for the photons of the beam to generate a photon plasma at a surface layer of the target, wherein the surface layer is configured to preferentially absorb electrons from the photon plasma to generate corresponding free positrons; and
   an electrode arrangement comprising one or more electrodes that are configured to apply an electric field to the photon plasma to extract the free positrons therefrom and to guide the positrons to form the positron beam;
   wherein at least the target and the electrode arrangement are included within a vacuum chamber configured in use to provide a vacuum condition in which the target and the electrode arrangement are arranged to function.

2. The positron source of claim 1, wherein the surface layer is configured to include a doped semiconductor material for providing the surface layer, optionally wherein the doped semiconductor includes at least one of: p-doped Silicon, p-doped Gallium Arsenide, p-doped Graphene, Graphene, p-doped Silicon Carbide.

3. The positron source of claim 1, wherein the positron source is configured for the beam of photons to propagate in a direction that is substantially parallel to a plane of the surface layer when the beam of photons is received at the surface layer for generating the photon plasma, optionally wherein the beam of photons is arranged to propagate as an evanescent wave over the surface layer when generating the photon plasma.

4. The positron source of claim 1, wherein the target is supported on a rotatable table that is arranged to rotate when the positron source is in operation, to increase an area of the surface layer that is exposed to the beam of photons.

5. The positron source of claim 1, wherein the positron source further includes a beam scanner for scanning the beam of photons over the surface layer when the positron source is in operation, to increase an area of the surface layer that is exposed to the beam of photons, optionally wherein the beam scanner is implemented as an actuated or rotatable mirror, prism or diffraction grating.

6. The positron source of claim 1, wherein the electrode arrangement is configured to remove a native oxide of the surface layer prior to the surface layer being configured to interact with the photon plasma to generate positrons, wherein the electrode arrangement is configured to be driven by a radio-frequency signal to excite a trace gas introduced into the vacuum chamber to cause sputtering or reactive ion etching at the surface layer.

7. The positron source of claim 1, wherein the laser arrangement is configured to generate the beam of photons as a pulsed photon beam, optionally wherein the pulsed photon beam has a pulse energy in a range of 10 milliJoules to 1 Joule per pulse, and a pulse duration in a range of 10 picoSeconds to 100 nanoSeconds.

8. The positron source of claim 1, wherein the laser arrangement is configured to generate the beam of photons to have a radiation wavelength in a range of 2 μm to 50 nm.

9. The positron source of claim 1, wherein the positron source is configured to move the beam or photons in a step-wise manner over the surface layer, wherein the beam of photons at the surface layer is substantially stationary at an instance that a pulse of photons is output from the laser arrangement.

10. The positron source of claim 1, wherein the electrode arrangement further includes a first electrode for generating an electric field to extract positrons from the photon plasma, and one or more second electrodes for forming the positron beam to be at least one of: divergent, collimated, convergent.

11. The positron source of claim 1, wherein the positron source is configured for use with at least one of: an electron microscope, a positron tomography apparatus, a semiconductor manufacturing apparatus, an energy storage device, a propulsion device.

12. The positron source of claim 1, wherein the positron source is configured to include a mirror arrangement for guiding the photon beam to make multiple passes over the surface layer in use, to enhance a yield of positrons generated at the surface layer for a given pulse energy of the photon beam.

13. A method for operating a positron source for generating a positron beam therefrom, wherein the positron source includes:
   a laser arrangement configured to generate a beam of photons;
   a target configured to receive the beam of photons;
   an electrode arrangement comprising one or more electrodes;
   wherein at least the target and the electrode arrangement are included within a vacuum chamber;
   wherein the method includes:

configuring the vacuum chamber in use to provide a vacuum condition in which at least the target and the electrode arrangement are arranged to function;

configuring the positron source for the photons of the beam to generate a photon plasma at a surface layer of the target, wherein the surface layer is configured to preferentially absorb electrons from the photon plasma to generate corresponding free positrons; and configuring the one or more electrodes to apply an electric field to the photon plasma to extract the free positrons therefrom and to guide the positrons to form the positron beam.

14. A software product stored on a non-transitory machine-readable data carrier, wherein the software product is executable on computing hardware to implement the method of claim 13.

15. A positron source for generating a positron beam, wherein the positron source includes an optical waveguide array device including a substrate, and at least one waveguide structure formed onto the substrate, wherein the at least one waveguide structure is fabricated at least in part from a material that exhibits one or more non-linear optical effects when in use, and an electrode arrangement configured to control the one or more non-linear optical effects and to extract at least one of accelerated electrons and positrons from the at least one waveguide structure, and wherein the optical waveguide array device is configured in use to separate photons input on the at least one waveguide structure using the one or more non-linear optical effects into their respective electrons and positrons, and to guide the respective electrons and positrons into their respective regions of the at least one waveguide structure to cause a matter-antimatter dipole to be formed within the at least one waveguide structure waveguide structure for imparting energy to at least one of the electrons and the photons to cause acceleration thereof, wherein the positrons are extracted to generate the positron beam.

16. The positron source of claim 15, wherein the substrate is fabricated from a dielectric material, and the material of the at least one waveguide structure includes at least one of: Lithium Niobate ($LiNiO_3$), Barium Niobate ($BaNiO_3$), Graphene.

17. The positron source of claim 15, wherein the substrate is fabricated from a dielectric material, optionally at least one of: quartz, fused silica.

18. The positron source of claim 15, wherein the electrode arrangement comprises a configuration of electrodes whose elongate axes are configured to be substantially parallel to, or substantially orthogonal to, elongate axes of a plurality elongate waveguides into which the corresponding electrons and positrons are selectively diverted when the device is in operation, optionally wherein the electrode arrangement is fabricated from at least one of: Titanium, Aluminium, Indium, Silver.

19. The positron source of claim 15, wherein the device includes a plurality of the at least one waveguide structure arranged in a cascaded configuration.

20. The positron source of claim 15, wherein the device further includes a laser arrangement configured in use to provide photons to the at least one waveguide structure, optionally wherein the laser arrangement is configured to function in at least one of: a continuous mode, a pulsed mode, a combination of continuous and pulsed modes.

21. The positron source of claim 15, wherein waveguides of the at least one waveguide structure are disposed in a parallel mutually spaced-apart manner with a distance (d) therebetween, wherein the distance is substantially of a similar size to a wavelength of the photons supplied to the at least one waveguide structure when in operation, optionally wherein the distance (d) is configured to allow for photon coherence to be maintained between mutually adjacent elongate waveguides of the at least one waveguide structure.

22. A method for operating a positron source to generate a positron beam, wherein the positron source includes an optical waveguide array device including a substrate, and at least one waveguide structure formed onto the substrate, wherein the method includes:
(i) arranging for the at least one waveguide structure to be fabricated at least in part from a material that exhibits one or more non-linear optical effects when in use;
(ii) optionally configuring an electrode arrangement to control the one or more non-linear optical effects and to extract at least one of accelerated electrons and positrons from the at least one waveguide structure;
(iii) configuring the optical waveguide array device, when in use, to separate photons input on the at least one waveguide structure using the one or more non-linear optical effects into their respective electrons and positrons; and
(iv) guiding the respective electrons and positrons into their respective regions of the at least one waveguide structure to cause a matter-antimatter dipole to be formed within the at least one waveguide structure waveguide structure for imparting energy to at least one of the electrons and the positrons to cause acceleration thereof, wherein the method further comprises extracting the positrons to form the positron beam.

23. A software product recorded on a non-transitory machine-readable data carrier, wherein the software product is executable on a computing hardware of a device, to implement a method as claimed in claim 22.

* * * * *